US012446386B2

(12) United States Patent
Kim et al.

(10) Patent No.: US 12,446,386 B2
(45) Date of Patent: Oct. 14, 2025

(54) DISPLAY DEVICE AND METHOD OF MANUFACTURING THE SAME

(71) Applicant: Samsung Display Co., LTD., Yongin-si (KR)

(72) Inventors: Soo Chul Kim, Yongin-si (KR); Jin Taek Park, Yongin-si (KR); Ki Seong Seo, Yongin-si (KR); Dae Ho Song, Yongin-si (KR); So Yeon Yoon, Yongin-si (KR); Jin Woo Choi, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 623 days.

(21) Appl. No.: 17/684,782

(22) Filed: Mar. 2, 2022

(65) Prior Publication Data
US 2022/0352248 A1 Nov. 3, 2022

(30) Foreign Application Priority Data

Apr. 30, 2021 (KR) .................. 10-2021-0056832

(51) Int. Cl.
H10H 29/14 (2025.01)
H10H 20/01 (2025.01)
H10H 20/851 (2025.01)
H10H 20/855 (2025.01)
H10H 20/856 (2025.01)
H10H 20/857 (2025.01)

(52) U.S. Cl.
CPC .......... *H10H 29/142* (2025.01); *H10H 20/01* (2025.01); *H10H 20/851* (2025.01); *H10H 20/855* (2025.01); *H10H 20/856* (2025.01); *H10H 20/857* (2025.01); *H10H 20/0361* (2025.01)

(58) Field of Classification Search
CPC ..................... H01L 27/156; H01L 25/0753
See application file for complete search history.

(56) References Cited

U.S. PATENT DOCUMENTS

| 10,083,944 | B2 | 9/2018 | Lee | |
|---|---|---|---|---|
| 10,566,381 | B2 | 2/2020 | Kwak et al. | |
| 11,538,851 | B2 | 12/2022 | Choi et al. | |
| 2013/0048940 | A1* | 2/2013 | Sills | H01L 33/0093 257/E33.008 |
| 2016/0133675 | A1* | 5/2016 | Yata | H10K 59/353 257/89 |
| 2018/0190748 | A1* | 7/2018 | Im | H10K 59/121 |
| 2019/0326351 | A1* | 10/2019 | Chio | H01L 33/44 |

(Continued)

FOREIGN PATENT DOCUMENTS

| JP | 2020-205417 | 12/2020 |
|---|---|---|
| KR | 10-2018-0059249 | 6/2018 |

(Continued)

Primary Examiner — Matthew L Reames
(74) Attorney, Agent, or Firm — CANTOR COLBURN LLP

(57) ABSTRACT

A display device includes bank patterns disposed on a substrate, light emitting elements disposed between side surfaces of the bank patterns on the substrate, and a color filter layer disposed between the side surfaces of the bank patterns and disposed on the light emitting elements. The light emitting elements and the bank patterns include a same material.

13 Claims, 28 Drawing Sheets

(56) References Cited

U.S. PATENT DOCUMENTS

| | | | |
|---|---|---|---|
| 2020/0013766 A1* | 1/2020 | Kim | H01L 25/167 |
| 2020/0349882 A1 | 11/2020 | Kim et al. | |
| 2020/0373366 A1* | 11/2020 | Sim | H10K 50/818 |
| 2021/0126045 A1 | 4/2021 | Yeon et al. | |
| 2022/0165921 A1 | 5/2022 | Choi et al. | |

FOREIGN PATENT DOCUMENTS

| | | |
|---|---|---|
| KR | 10-1890582 | 8/2018 |
| KR | 10-2020-0005692 | 1/2020 |
| KR | 10-2020-0127777 | 11/2020 |
| KR | 10-2020-0137059 | 12/2020 |
| KR | 10-2022-0070141 | 5/2022 |

* cited by examiner

DISPLAY DEVICE AND METHOD OF MANUFACTURING THE SAME

CROSS-REFERENCE TO RELATED APPLICATION(S)

This application claims priority to and the benefit of Korean Patent Application No. 10-2021-0056832 under 35 U.S.C. § 119, filed in the Korean Intellectual Property Office on Apr. 30, 2021, the entire contents of which are incorporated herein by reference.

BACKGROUND

1. Technical Field

The embodiments relate to a light emitting display device and a method of manufacturing the same.

2. Description of the Related Art

Recently, as interest in information display has been increasing, research and development on display devices have been continuously conducted.

SUMMARY

An object of the disclosure is to provide a display device that may reduce light leakage and/or color mixing caused by overlay defects in the color filter layers, and a method of manufacturing the display device.

The objects of the embodiments are not limited to the above, and other objects that are not mentioned herein may be understood by those of ordinary skill in the art from the following description.

A display device according to an embodiment may include bank patterns disposed on a substrate; light emitting elements disposed between side surfaces of the bank patterns, the light emitting elements and the bank patterns including a same material; and a color filter layer disposed on the light emitting elements and disposed between the side surfaces of the bank patterns.

Each of the light emitting elements and the bank patterns may include a first semiconductor layer; a second semiconductor layer; and an active layer disposed between the first semiconductor layer and the second semiconductor layer.

The bank patterns may further include a first mask layer and a second mask layer that are disposed on the second semiconductor layer.

The display device may further include a color conversion layer disposed between the side surfaces of the bank patterns and disposed on the light emitting elements.

The display device may further include a passivation layer disposed between the color conversion layer and the color filter layer.

The display device may further include a reflective layer disposed on the side surfaces of the bank patterns.

The display device may further include a light blocking layer disposed on upper surfaces of the bank patterns.

A display device according to an embodiment may include light emitting elements disposed on a substrate; and a color control layer disposed on the light emitting elements. The color control layer may include a silicon layer including bank patterns; and a color filter layer disposed between the bank patterns.

The display device may further include a color conversion layer disposed between the bank patterns.

The display device may further include a passivation layer disposed between the color filter layer and the color conversion layer.

The color control layer may include a reflective layer disposed on side surfaces of the bank patterns.

The display device may further include a light blocking layer overlapping the bank patterns.

The display device may further include an adhesive layer disposed between the color control layer and the light emitting elements.

A method of manufacturing a display device according to an embodiment may include forming light emitting elements on a substrate; forming a color conversion layer on the light emitting elements; forming a passivation layer on the color conversion layer; patterning the passivation layer to form groove patterns; and forming a color filter layer in the groove patterns.

The groove patterns may be formed to overlap the light emitting elements.

The forming of the color filter layer may include providing a color filter material layer on the passivation layer; and polishing the color filter material layer.

The method may further include forming bank patterns. The color conversion layer and the color filter layer may be formed between the bank patterns.

The forming of the bank patterns and the forming of the light emitting elements may be performed simultaneously.

The forming of the light emitting elements and forming of the bank patterns may include providing a light emitting stack structure on the substrate; and patterning the light emitting stack structure.

The light emitting stack structure may include a first semiconductor layer; a second semiconductor layer on the first semiconductor layer; and an active layer between the first semiconductor layer and the second semiconductor layer.

BRIEF DESCRIPTION OF THE DRAWINGS

The above and other aspects and features of the disclosure will become more apparent by describing in detail embodiments thereof with reference to the attached drawings.

DETAILED DESCRIPTION OF THE EMBODIMENTS

Figure 1:
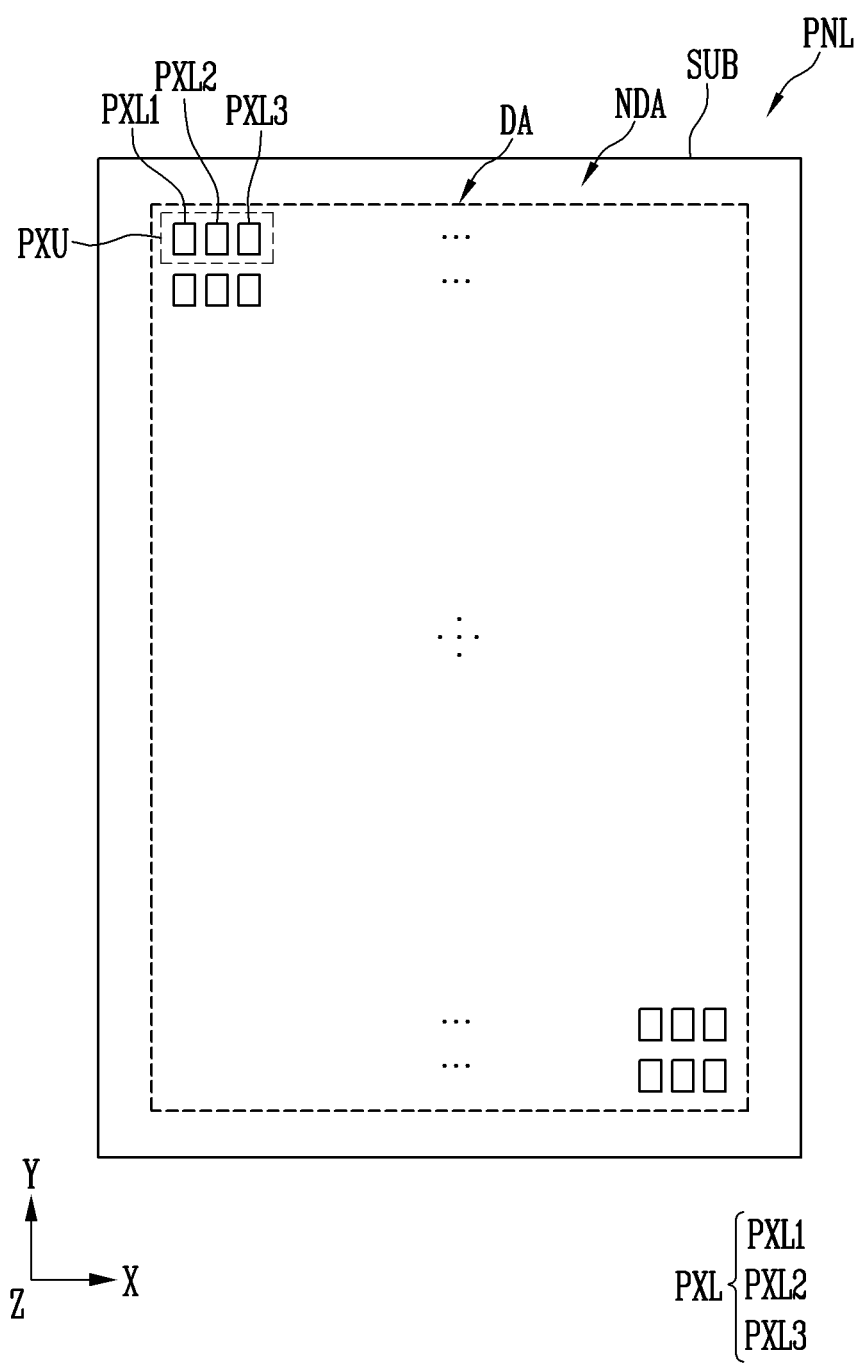
FIG. 1 is a schematic plan view illustrating a display device according to an embodiment.

Effects and features of the disclosure, and methods of achieving them will be clarified with reference to embodiments described below in detail with reference to the drawings. The disclosure, however, is not limited to the following embodiments and may be embodied in different forms. These embodiments are provided so that the disclosure will be thorough and complete and will fully convey the concept of the embodiments of the disclosure to those of ordinary skill in the art.

The terms used in the specification are for describing embodiments and are not intended to limit the embodiments.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

As used herein, the singular form is intended to include the plural forms as well, unless context clearly indicates otherwise. It will also be understood that the terms "comprises" and/or "includes", when used herein, specify the presence of stated elements, steps, operations, and/or devices, but do not preclude the presence or addition of other elements, steps, operations, and/or devices unless otherwise defined.

In the drawings, sizes, thicknesses, ratios, and dimensions of the elements may be exaggerated for ease of description and for clarity. Like numbers refer to like elements throughout.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween. It will be understood that the terms "connected to" or "coupled to" may include a physical or electrical connection or coupling.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in detail with reference to the accompanying drawings.

FIG. 1 is a schematic plan view illustrating a display device according to an embodiment.

FIG. 1 illustrates a display device that may use a light emitting element as a light source. FIG. 1 illustrates a display panel PNL provided in the display device.

For convenience of description, the structure of the display panel PNL is illustrated focusing on a display area DA in FIG. 1. However, in some embodiments, at least one driving circuit unit (not illustrated) (for example, at least one of a scan driver and a data driver), lines (not illustrated), and/or pads (not illustrated) may be further provided on the display panel PNL.

Referring to FIG. 1, the display panel PNL may include a substrate SUB and a pixel unit PXU disposed on the substrate SUB. The pixel unit PXU may include first pixels PXL1, second pixels PXL2, and/or third pixels PXL3. Hereinafter, at least one of the first pixels PXL1, the second pixels PXL2, and the third pixels PXL3 is arbitrarily referred to as "pixel PXL" or "pixels PXL", or the first, second, and third pixels PXL1, PXL2, and PXL3 are collectively referred to as "pixel PXL" or "pixels PXL".

The substrate SUB constitutes a base member of the display panel PNL, and may be a rigid or flexible substrate or film. For example, the substrate SUB may be a rigid substrate including glass or tempered glass, or a flexible substrate (or thin film) including plastic or metal, and the material and/or physical properties of the substrate SUB are not particularly limited.

The display panel PNL and the substrate SUB for forming the same may include a display area DA for displaying an image and a non-display area NDA excluding the display area DA. Pixels PXL may be disposed in the display area DA. Lines, pads, and/or built-in circuits electrically connected to the pixels PXL of the display area NDA may be disposed in the non-display area NDA. The pixels PXL may be regularly arranged according to a stripe or PENTILE™ arrangement structure. However, the arrangement structure of the pixels PXL is not necessarily limited thereto, and the pixels PXL may be disposed in the display area DA in a variety of structures and/or methods.

In some embodiments, two or more types of pixels PXL emitting lights of different colors may be disposed in the display area DA. For example, the first pixels PXL1 emitting light of a first color, the second pixels PXL2 emitting light of a second color, and the third pixels PXL3 emitting light of a third color may be disposed in the display area DA. At least one of the first to third pixels PXL1, PXL2, and PXL3 adjacent to each other may constitute one pixel unit PXU capable of emitting lights of a variety of colors. For example, the first to third pixels PXL1, PXL2, and PXL3 may each be a sub-pixel emitting a color light. In some embodiments, the first pixel PXL1 may be a red pixel emitting red light, the second pixel PXL2 may be a green pixel emitting green light, and the third pixel PXL3 may be a blue pixel emitting blue light, but the embodiments are not necessarily limited thereto.

In an embodiment, each of the first pixel PXL1, the second pixel PXL2, and the third pixel PXL3 includes light emitting elements emitting light of the same color. Since color conversion layers and/or color filters of different colors disposed on each light emitting element are included, lights of the first color, the second color, and the third color may be emitted. In an embodiment, the first pixel PXL1, the second pixel PXL2, and the third pixel PXL3 include a first color light emitting element, a second color light emitting element, and a third color light emitting element as a light source, and thus emit the lights of the first color, the second color, and the third color, respectively. However, the color, type, and/or number of pixels PXL constituting the pixel unit PXU are not particularly limited. The color of light emitted from each pixel PXL may be changed.

The pixel PXL may include at least one light source driven by a certain control signal (e.g., a scan signal and a data signal) and/or certain power (e.g., first power and second power). In an embodiment, the light source may include ultra-small columnar light emitting elements having a size as small as a nanometer scale to a micrometer scale. However, the embodiments are not necessarily limited thereto, and different types of light emitting elements may be used as the light source of the pixel PXL.

In an embodiment, each pixel PXL may be configured as an active pixel. However, the types, structures, and/or driving methods of the pixels PXL applicable to the display device are not particularly limited. For example, the pixels PXL may be a passive type or an active type light emitting display device having a variety of structures and/or driving methods.

Figure 2:
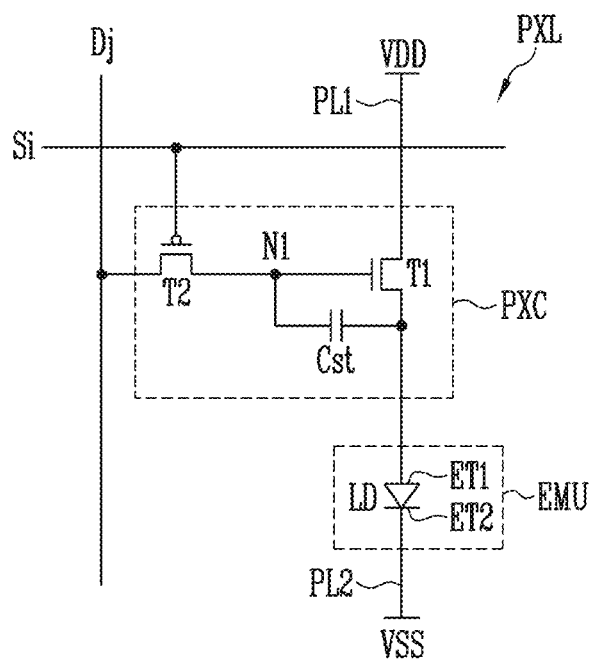
FIG. 2 is a schematic diagram of an equivalent circuit of a pixel according to an embodiment.

FIG. 2 is a schematic diagram of an equivalent circuit of a pixel according to an embodiment.

FIG. 2 illustrates an electrical connection relationship between elements included in the pixel PXL that is applicable to an active display device. However, the types of elements included in the pixel PXL are not necessarily limited thereto.

In some embodiments, the pixel PXL illustrated in FIG. 2 may be any one of the first pixel PXL1, the second pixel PXL2, and the third pixel PXL3 provided in the display panel PNL of FIG. 1. The first pixel PXL1, the second pixel PXL2, and the third pixel PXL3 may have substantially an identical or similar structure to each other.

Referring to FIG. 2, the pixel PXL may include an emission unit EMU for generating light having a luminance corresponding to a data signal. The pixel PXL may further include a pixel circuit PXC for driving the emission unit EMU.

In some embodiments, the emission unit EMU may include at least one light emitting element LD electrically connected between a first power line PL1 to which a voltage of a first power supply VDD is applied and a second power line PL2 to which a voltage of a second power supply VSS is applied. For example, the emission unit EMU may include a first electrode ET1 electrically connected to the first power supply VDD via the pixel circuit PXC and the first power line PL1, a second electrode ET2 electrically connected to the second power supply-source VSS via the second power line PL2, and a light emitting element LD electrically connected between the first electrode ET1 and the second electrode ET2. In an embodiment, the first electrode ET1 may be an anode electrode, and the second electrode ET2 may be a cathode electrode.

The light emitting element LD may include an end portion electrically connected to the first power supply VDD and another end portion electrically connected to the second power supply VSS. In some embodiments, an end portion of the light emitting element LD and the first electrode may be integral with each other and electrically connected to each other. Another end portion of the light emitting element LD and the second electrode ET2 may be integral with each other and electrically connected to each other. The first power supply VDD and the second power supply VSS may have different potentials. The potential difference between the first and second power supplies VDD and VSS may be set to be greater than or equal to the threshold voltage of the light emitting element LD during the emission period of the pixel PXL.

The light emitting element LD may constitute an effective light source of the emission unit EMU. The light emitting element LD may emit light having a luminance corresponding to a driving current supplied through the pixel circuit PXC. For example, during each frame period, the pixel circuit PXC may supply, to the emission unit EMU, a driving current corresponding to a gray scale value of the corresponding frame data. The driving current supplied to the emission unit EMU may flow through the light emitting element LD. Therefore, the emission unit EMU may emit light while the light emitting element LD emits light having a luminance corresponding to the driving current.

The pixel circuit PXC may be electrically connected to a scan line Si and a data line Dj of the pixel PXL. For example, when the pixel PXL is disposed in an i-th row (i is a natural number) and a j-th column (j is a natural number) of the display area DA, the pixel circuit PXC of the pixel PXL may be electrically connected to an i-th scan line Si and a j-th data line Dj of the display area DA. In some embodiments, the pixel circuit PXC may include first and second transistors T1 and T2 and a storage capacitor Cst. However, the structure of the pixel circuit PXC is not limited to the embodiment illustrated in FIG. 2.

The pixel circuit PXC may include first and second transistors T1 and T2 and a storage capacitor Cst.

A first terminal of the first transistor T1 (driving transistor) may be connected to the first power source VDD, and a second terminal may be electrically connected to the light emitting element LD. A gate electrode of the first transistor T1 may be electrically connected to a first node N1. The first transistor T1 controls the amount of the driving current supplied to the light emitting element LD in response to the voltage of the first node N1.

A first terminal of the second transistor T2 (switching transistor) may be electrically connected to a j-th data line Dj, and a second terminal may be electrically connected to the first node N1. The first terminal and the second terminal of the second transistor T2 may be different terminals. For example, when the first terminal is a source electrode, the second terminal may be a drain electrode. A gate electrode of the second transistor T2 may be electrically connected to the i-th scan line Si.

The second transistor T2 may be turned on when a scan signal of a voltage at which the second transistor T2 can be turned on is supplied from the i-th scan line Si, and may electrically connect the j-th data line Dj to the first node N1. At this time, the data signal of the frame is supplied to the j-th data line Dj. Therefore, the data signal may be transmitted to the first node N1. The data signal transmitted to the first node N1 may be charged in the storage capacitor Cst.

The storage capacitor Cst may be charged with the voltage corresponding to the data signal supplied to the first node N1, and the charged voltage may be maintained until the data signal of the next frame is supplied.

FIG. 2 illustrates the pixel circuit PXC including the second transistor T2 for transmitting the data signal to the inside of the pixel PXL, the storage capacitor Cst for storing the data signal, and the first transistor T1 for supplying the driving current corresponding to the data signal to the light emitting element LD, but the embodiments are not necessarily limited thereto, and the structure of the pixel circuit PXC may be modified. For example, the pixel circuit PXC may include a transistor element for compensating for the threshold voltage of the first transistor T1, a transistor element for initializing the first node N1, and/or a transistor element for controlling the emission time of the light emitting elements LD, or other circuit elements such as a boosting capacitor for boosting the voltage of the first node N1. The first and second transistors T1 and T2 of the pixel circuit PXC are not limited to FIG. 2, and may be changed to NMOS or PMOS.

Figure 3:
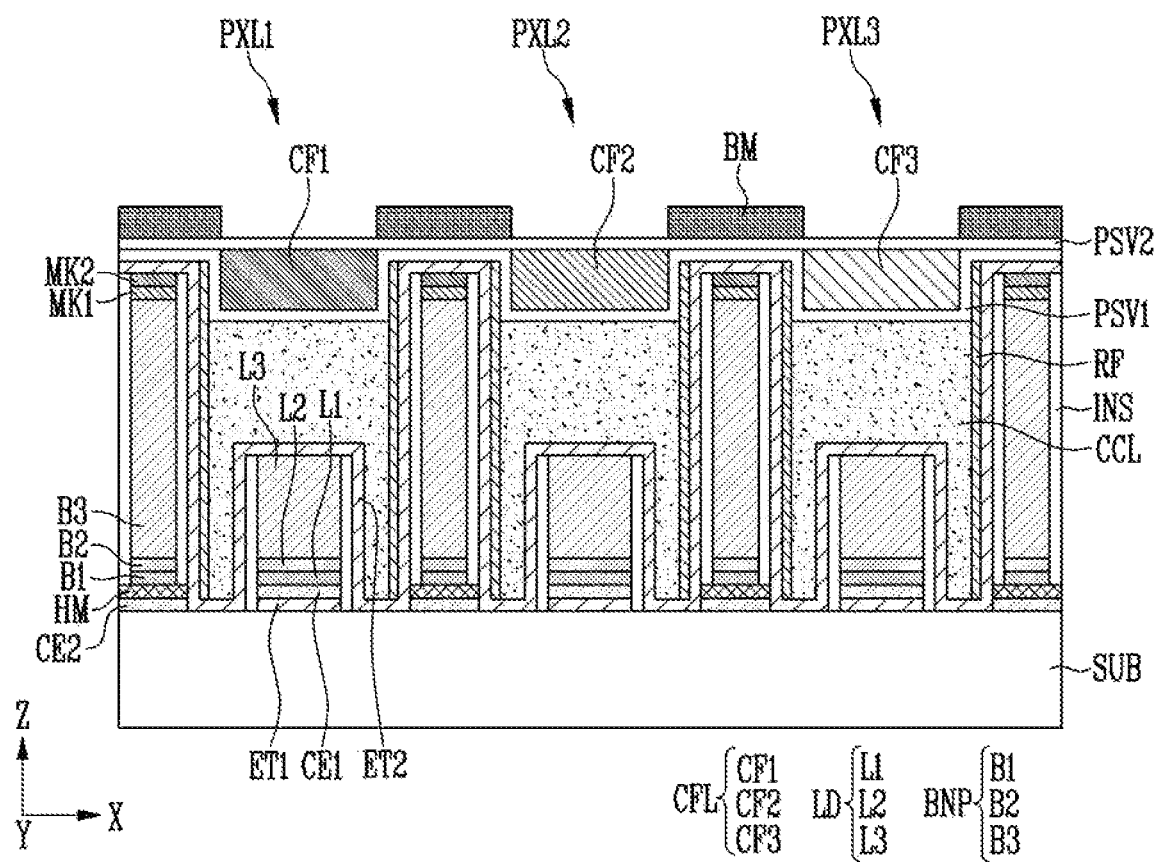
FIGS. 3 and 4 are schematic cross-sectional views illustrating a pixel according to an embodiment.
Figure 4:
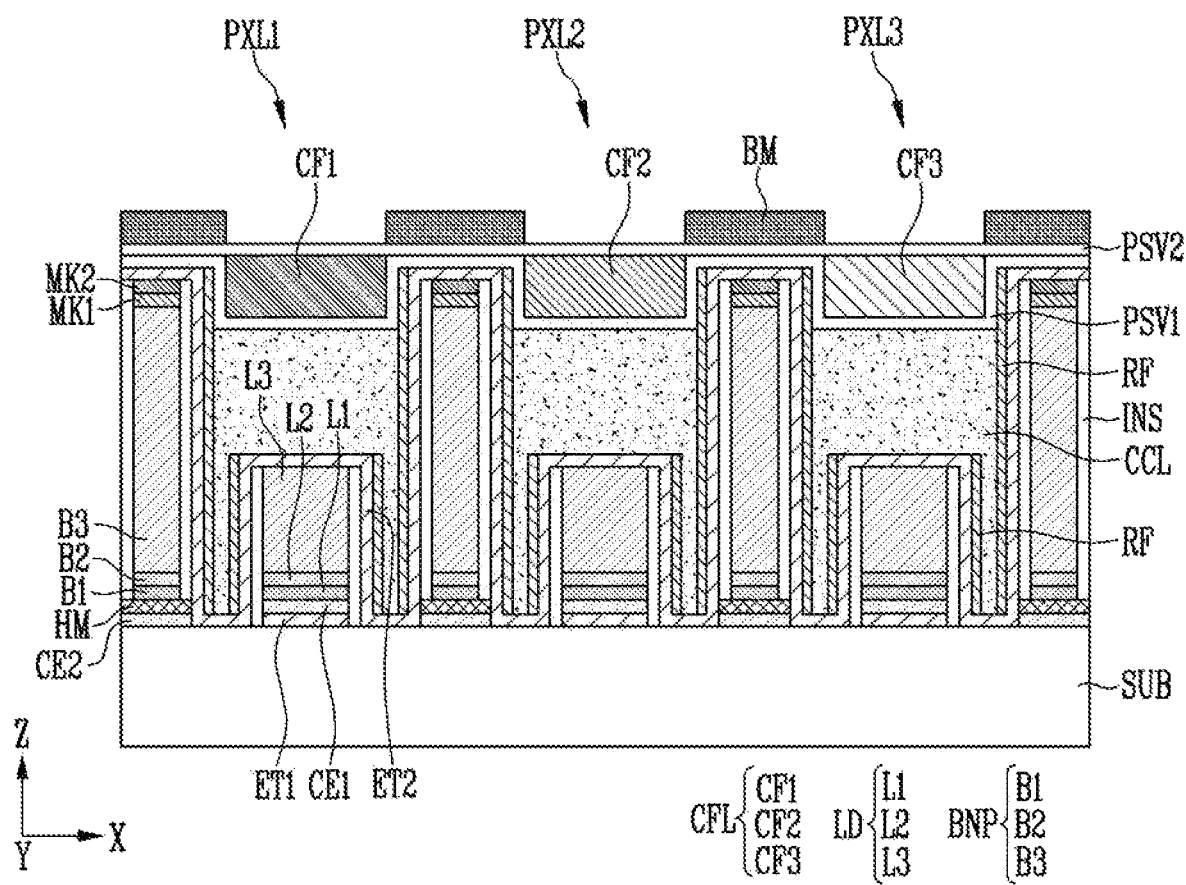

FIGS. 3 and 4 are cross-sectional views illustrating a pixel according to an embodiment.

FIGS. 3 and 4 schematically illustrate cross-sectional structures of a first pixel PXL1, a second pixel PXL2, and a third pixel PXL3 adjacent to each other.

Referring to FIGS. 3 and 4, a pixel PXL and a display device including the same may include a substrate SUB, and bank patterns BNP, light emitting elements LD, and a color conversion layer CCL, and a color filter layer CFL, which are disposed on the substrate SUB.

The substrate SUB may be a driving substrate including circuit elements including transistors constituting the pixel circuit (PXC of FIG. 2) of each pixel PXL. For example, the substrate SUB may use a CMOS substrate including a combination of NMOS and PMOS, but the embodiments are not limited thereto.

The bank patterns BNP may be disposed at a boundary between the first to third pixels PXL1, PXL2, and PXL3 on the substrate SUB. The bank patterns BNP may be provided in a shape extending in one direction. For example, the bank patterns BNP may be provided on the substrate SUB in a shape extending from the substrate SUB in a third direction (Z-axis direction).

The bank patterns BNP may include a first semiconductor layer B1, a second semiconductor layer B3, and an active layer B2 disposed between the first and second semiconductor layers B1 and B3. For example, the first semiconductor layer B1, the active layer B2, and the second semiconductor layer B3 of the bank patterns BNP may be sequentially stacked on the substrate SUB in the third direction (Z-axis direction).

The first semiconductor layer B1 of the bank patterns BNP may include, for example, at least one p-type semiconductor layer. For example, the first semiconductor layer B1 of the bank patterns BNP may include at least one semiconductor material selected from GaN, InAlGaN, AlGaN, InGaN, AlN, and InN, and may include a p-type semiconductor layer doped with a first conductive dopant (or p-type dopant) such as Mg, Zn, Ca, Sr, or Ba. For example, the first semiconductor layer B1 of the bank patterns BNP may include a GaN semiconductor material doped with a first conductive dopant (or a p-type dopant), but the embodiments are not necessarily limited thereto, and a variety materials may form the first semiconductor layer B1 of the bank patterns BNP.

The active layer B2 of the bank patterns BNP may be disposed between the first semiconductor layer B1 and the second semiconductor layer B3. The active layer B2 of the bank patterns BNP may include any one of a single well structure, a multi-well structure, a single quantum well structure, a multi-quantum well (MQW) structure, a quantum dot structure, or a quantum wire structure, but the embodiments are not necessarily limited thereto. The active layer B2 of the bank patterns BNP may include materials such as GaN, InGaN, InAlGaN, AlGaN, AlN, or the like. Other materials may also form the active layer B2 of the bank patterns BNP.

The second semiconductor layer B3 of the bank patterns BNP may be disposed on the active layer B2, and may include a semiconductor layer of a different type from that of the first semiconductor layer B1. In an embodiment, the second semiconductor layer B3 of the bank patterns BNP may include at least one n-type semiconductor layer. For example, the second semiconductor layer B3 of the bank patterns BNP may include any one semiconductor material selected from GaN, InAlGaN, AlGaN, InGaN, AlN, and InN, and may be an n-type semiconductor layer doped with a second conductive dopant (or an n-type dopant) such as Si, Ge, or Sn. For example, the second semiconductor layer B3 of the bank patterns BNP may include a GaN semiconductor material doped with a second conductive dopant (or an n-type dopant). However, the material constituting the second semiconductor layer B3 of the bank patterns BNP is not limited thereto, and the second semiconductor layer B3 of the bank patterns BNP may be formed of a variety materials.

In some embodiments, the bank patterns BNP may further include mask layers MK1 and MK2 disposed on the second semiconductor layer B3. The mask layers MK1 and MK2 may include a first mask layer MK1 disposed on the second semiconductor layer B3 and a second mask layer MK2 disposed on the first mask layer MK1. The first mask layer MK1 and the second mask layer MK2 may be formed of different materials. For example, the first mask layer MK1 may include silicon oxide ($SiO_x$) and the second mask layer MK2 may include nickel (Ni), but the embodiments are not limited thereto.

The light emitting elements LD may be respectively disposed in the first to third pixels PXL1, PXL2, and PXL3. The light emitting elements LD may be disposed between side surfaces of the bank patterns BNP on the substrate SUB.

Each of the light emitting elements LD may be provided in a variety of shapes. For example, the light emitting elements LD may have a rod-like shape a bar-like shape that is long in the third direction (Z-axis direction) (for example, an aspect ratio is greater than 1), but the embodiments are not necessarily limited thereto. For example, each of the light emitting elements LD may have a pillar shape in which a diameter of an end portion is different from a diameter of another end portion. The light emitting elements LD may be light emitting diodes (LEDs) manufactured so as to have a diameter and/or a length of about a nanometer scale to about a micrometer scale. However, the embodiments are not necessarily limited thereto, and the size of the light emitting element LD may be changed to meet the requirements (or design conditions) of lighting devices or display devices to which the light emitting element LD is applied.

The light emitting elements LD may include a first semiconductor layer L1, a second semiconductor layer L3, and an active layer L2 disposed between the first and second semiconductor layers L1 and L3. For example, the first semiconductor layer L1, the active layer L2, and the second semiconductor layer L3 of the light emitting elements LD may be sequentially stacked on the substrate SUB in the third direction (Z-axis direction).

The first semiconductor layer L1 of the light emitting elements LD may include, for example, at least one p-type semiconductor layer. For example, the first semiconductor layer L1 of the light emitting elements LD may include at least one semiconductor material selected from GaN, InAlGaN, AlGaN, InGaN, AlN, and InN, and may include a p-type semiconductor layer doped with a first conductive dopant (or p-type dopant) such as Mg, Zn, Ca, Sr, or Ba. For example, the first semiconductor layer L1 of the light emitting elements LD may include a GaN semiconductor material doped with a first conductive dopant (or a p-type dopant), but the embodiments are not necessarily limited thereto, and a variety of materials may form the first semiconductor layer L1 of the light emitting elements LD.

The active layer L2 of the light emitting elements LD may be disposed between the first semiconductor layer L1 and the second semiconductor layer L3. The active layer L2 of the light emitting elements LD may include any one of a single well structure, a multi-well structure, a single quantum well structure, a multi-quantum well (MQW) structure, a quantum dot structure, or a quantum wire structure, but the embodiments are not necessarily limited thereto. The active layer L2 of the light emitting elements LD may include GaN, InGaN, InAlGaN, AlGaN, AlN, or the like. A variety of materials may form the active layer L2 of the light emitting elements LD.

When a signal (or voltage) is applied to the end portion of each of the light emitting elements LD, electron-hole pairs are recombined in the active layer L2 of the light emitting elements LD, and each light emitting element LD emits light. By controlling the light emission of the light emitting element LD using this principle, the light emitting elements LD may be used as light sources for a variety of light emitting devices including pixels PXL of the display device.

In some embodiments, an electron blocking layer (not illustrated) may be further disposed between the active layer L2 and the first semiconductor layer L1 of the light emitting elements LD. The electron blocking layer may block the flow of electrons supplied from the second semiconductor layer L3 from escaping to the first semiconductor layer L1, thereby increasing the electron-hole recombination probability in the active layer L2. The energy bandgap of the electron blocking layer may be greater than the energy bandgap of the active layer L2 and/or the first semiconductor layer L1, but the embodiments are not limited thereto.

In some embodiments, a superlattice layer (not illustrated) may be disposed between the active layer L2 and the second semiconductor layer L3 of the light emitting elements LD. The superlattice layer relieves the stress of the active layer L2 and the second semiconductor layer L3 to improve the quality of the light emitting elements LD. For example, the superlattice layer may be formed in a structure in which InGaN and GaN are alternately stacked, but the embodiments are not limited thereto.

The second semiconductor layer L3 of the light emitting elements LD may be disposed on the active layer L2, and may include a semiconductor layer of a different type from that of the first semiconductor layer L1. In an embodiment, the second semiconductor layer L3 of the light emitting elements LD may include at least one n-type semiconductor layer. For example, the second semiconductor layer L3 of the light emitting elements LD may include any one semiconductor material selected from GaN, InAlGaN, AlGaN, InGaN, AlN, and InN, and may be an n-type semiconductor layer doped with a second conductive dopant (or an n-type dopant) such as Si, Ge, or Sn. For example, the second semiconductor layer L3 of the light emitting elements LD may include a GaN semiconductor material doped with a second conductive dopant (or an n-type dopant). However, the material constituting the second semiconductor layer L3 of the light emitting elements LD is not limited thereto, and the second semiconductor layer L3 of the light emitting elements LD may be formed of a variety of materials.

In an embodiment, the light emitting elements LD and the bank patterns BNP may include a same material. For example, the first semiconductor layer L1, the active layer L2, and/or the second semiconductor layer L3 of the light emitting elements LD, the first semiconductor layer B1, the active layer B2, and/or the second semiconductor layer B3 of the bank patterns BNP may include the same material. The first semiconductor layer L1, the active layer L2, and/or the second semiconductor layer L3 of the light emitting elements LD may be simultaneously formed in the same process as the first semiconductor layer B1, the active layer B2, and/or the second semiconductor layer B3 of the bank patterns BNP. Therefore, the process of manufacturing the display device may be simplified to reduce process costs. A detailed description will be provided later with reference to FIGS. 8 to 10.

The light emitting elements LD may be disposed on the first electrode ET1 provided on the substrate SUB. For example, the first semiconductor layer L1 of the light emitting elements LD may be disposed on the first electrode ET1 and electrically connected to the first electrode ET1. The first electrode ET1 may include a metal or a metal oxide. For example, the first electrode ET1 may include copper (Cu), gold (Au), chromium (Cr), titanium (Ti), aluminum (Al), nickel (Ni), indium tin oxide (ITO), and oxides or alloys thereof, but the embodiments are not necessarily limited thereto.

In some embodiments, connection electrodes CE1 and CE2 may be further disposed between the substrate SUB and the light emitting elements LD and/or the bank patterns BNP. The connection electrodes CE1 and CE2 may include a first connection electrode CE1 provided between the light emitting elements LD and the substrate SUB and a second connection electrode CE2 provided between the bank patterns BNP and the substrate SUB.

The first connection electrode CE1 may be disposed between the first semiconductor layer L1 of the light emitting elements LD and the first electrode ET1 provided on the substrate SUB. The light emitting elements LD may be electrically connected to the first electrode ET1 provided on the substrate SUB through the first connection electrode CE1.

The second connection electrode CE2 and the first connection electrode CE1 may include a same material. For example, each of the first and second connection electrodes CE1 and CE2 may include a metal or a metal oxide. For example, the first and second connection electrodes CE1 and CE2 may include copper (Cu), gold (Au), chromium (Cr), titanium (Ti), aluminum (Al), nickel (Ni), indium tin oxide (ITO), and oxides or alloys thereof, but the embodiments are not necessarily limited thereto. The second connection electrode CE2 may be simultaneously formed in the same process as the first connection electrode CE1, but the embodiments are not limited thereto.

In some embodiments, a hard mask layer HM may be further disposed between the bank patterns BNP and the second connection electrode CE2. The hard mask layer HM may be disposed between the first semiconductor layer B1 and the second connection electrode CE2 of the bank patterns BNP. The hard mask layer HM may be omitted according to embodiments.

An insulating film INS may be provided on the surfaces of the light emitting elements LD and/or the bank patterns BNP. An insulating film INS may be provided on the side surfaces of the light emitting elements LD and/or the bank patterns BNP. The insulating film INS may prevent an electrical short circuit that may occur when the active layer L2 of the light emitting elements LD comes into contact with a conductive material other than the first and second semiconductor layers L1 and L3. In addition, the insulating film INS may minimize surface defects of the light emitting elements LD, thereby improving the lifespan and light emission efficiency of the light emitting elements LD.

The insulating film INS covers the side surfaces of the light emitting elements LD and/or the bank patterns BNP, and may be partially removed to expose the upper surfaces of the light emitting elements LD and/or the bank patterns BNP. For example, the insulating film INS covers the side surfaces of the light emitting elements LD, and may be partially removed to expose the second semiconductor layer L3 of the light emitting elements LD.

The insulating film INS may include silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the embodiments are not necessarily limited thereto.

A second electrode ET2 may be disposed on the light emitting elements LD. The second electrode ET2 may be directly disposed on the upper surface of the light emitting elements LD exposed by the insulating film INS and may contact the second semiconductor layer L3 of the light emitting elements LD. The second electrode ET2 may be disposed over the first to third pixels PXL1, PXL2, and PXL3.

The second electrode ET2 may be formed of a variety of transparent conductive materials. For example, the second electrode ET2 may include at least one transparent conductive material including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent so as to satisfy a level of light transmittance. Therefore, the light emitted from the light emitting elements LD may pass through the second electrode ET2 and may be emitted to the outside of the display panel PNL (refer to FIG. 1).

A color conversion layer CCL may be disposed on the light emitting elements LD. The color conversion layer CCL may be disposed between the bank patterns BNP. The color conversion layer CCL may be disposed between the side surfaces of the bank patterns BNP on the light emitting elements LD. The color conversion layer CCL may be provided in a space, or an opening defined by the bank patterns BNP.

The color conversion layer CCL may include quantum dots as a color conversion material that converts light emitted from the light emitting elements LD of each pixel PXL into light of a different color. For example, the color conversion layer CCL may include multiple quantum dots dispersed in a matrix material such as a base resin.

In an embodiment, the first to third pixels PXL1, PXL2, and PXL3 may include light emitting elements LD that emit light of the same color. For example, the first to third pixels PXL1, PXL2, and PXL3 may include light emitting elements LD that emit a third color (or blue). The color conversion layer CCL may include quantum dots that convert blue light emitted from the light emitting element LD into white light. For example, the color conversion layer CCL may include first quantum dots that convert blue light emitted from the blue light emitting element into red light, and second quantum dots that convert blue light into green light, but the embodiments are not necessarily limited thereto. When quantum dots are used as a color conversion material, blue light having a relatively short wavelength in the visible light band may be incident on the quantum dots, thereby increasing the absorption coefficient of the quantum dots. Therefore, the light efficiency and color reproducibility of the pixels PXL may be improved. The emission unit EMU of the first to third pixels PXL1, PXL2, and PXL3 may be configured using the light emitting elements LD (for example, blue light emitting elements) of the same color, thereby increasing the manufacturing efficiency of the display device. However, the embodiments are not limited thereto, and the first to third pixels PXL1, PXL2, and PXL3 may include light emitting elements LD that emit different color lights. For example, the first pixel PXL1 may include a first color (or red) light emitting element LD, the second pixel PXL2 may include a second color (or green) light emitting element LD, and the third pixel PXL3 may include a third color (or blue) light emitting element LD.

A first passivation layer PSV1 may be disposed on the color conversion layer CCL. The first passivation layer PSV1 may directly cover the color conversion layer CCL. The first passivation layer PSV1 may be disposed over the first to third pixels PXL1, PXL2, and PXL3. The first passivation layer PSV1 may prevent impurities such as moisture or air from penetrating from the outside to damage or contaminate the color conversion layer CCL. A surface of the first passivation layer PSV1 may contact the color conversion layer CCL, and another surface of the first passivation layer PSV1 may contact a color filter layer CFL, which will be described later.

In an embodiment, the first passivation layer PSV1 may include an organic material such as acrylates resin, epoxy resin, phenolic resin, polyamides resin, polyimides rein, polyesters resin, polyphenylenesulfides resin, or benzocyclobutene (BCB), but the embodiments are not necessarily limited thereto.

In some embodiments, the first passivation layer PSV1 may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$).

A color filter layer CFL may be disposed on the first passivation layer PVS1. A color filter layer CFL may be disposed between the bank patterns BNP. The color filter layer CFL may be disposed between the side surfaces of the bank patterns BNP on the light emitting elements LD and/or the color conversion layer CCL. The color filter layer CFL may be provided in a space, or an opening defined by the bank patterns BNP. As such, when the color filter layer CFL is provided in the space surrounded by the bank patterns BNP, it is possible to prevent overlay defects and improve light leakage and/or color mixing.

The color filter layer CFL may include color filters CF1, CF2, and CF3 matching the color of each pixel PXL. A full-color image may be displayed by disposing the color filters CF1, CF2, and CF3 matching the colors of the first to third pixels PXL1, PXL2, and PXL3, respectively.

The color filter layer CFL may include a first color filter CF1 disposed in the first pixel PXL1 to selectively transmit light emitted from the first pixel PXL1, a second color filter CF2 disposed in the second pixel PXL2 to selectively transmit light emitted from the second pixel PXL2, and a third color filter CF3 disposed in the third pixel PXL3 to selectively transmit light emitted from the third pixel PXL3.

In an embodiment, the first color filter CF1, the second color filter CF2, and the third color filter CF3 may be a red color filter, a green color filter, and a blue color filter, respectively, but the embodiments are not necessarily limited thereto. Hereinafter, when referring to any color filter among the first color filter CF1, the second color filter CF2, and the third color filter CF3, or generically referring to two or more types of color filters, the color filter or the color filters are referred to as "color filter CF" or "color filters CF".

The first color filter CF1 may overlap the light emitting element LD and the color conversion layer CCL of the first pixel PXL1 in the third direction (Z-axis direction). The first color filter CF1 may include a color filter material that selectively transmits light of a first color (or red). For example, when the first pixel PXL1 is a red pixel, the first color filter CF1 may include a red color filter material.

The second color filter CF2 may overlap the light emitting element LD and the color conversion layer CCL of the second pixel PXL2 in the third direction (Z-axis direction). The second color filter CF2 may include a color filter material that selectively transmits light of a second color (or green). For example, when the second pixel PXL2 is a green pixel, the second color filter CF2 may include a green color filter material.

The third color filter CF3 may overlap the light emitting element LD and the color conversion layer CCL of the third pixel PXL3 in the third direction (Z-axis direction). The third color filter CF3 may include a color filter material that selectively transmits light of a third color (or blue). For example, when the third pixel PXL3 is a blue pixel, the third color filter CF3 may include a blue color filter material.

A reflective layer RF may be disposed between the bank patterns BNP and the color conversion layer CCL and/or the color filter layer CFL. The reflective layer RF may reflect light emitted from the light emitting elements LD to improve light output efficiency of the display panel PNL (refer to FIG. 1). The reflective layer RF may be disposed on the side surfaces of the bank patterns BNP to prevent color mixing between adjacent pixels PXL. The material of the reflective layer RF is not particularly limited, and may include a variety of reflective materials.

According to an embodiment, as illustrated in FIG. 4, the reflective layer RF may be further disposed between the light emitting elements LD and the color conversion layer CCL. For example, the reflective layer RF may be disposed on side surfaces of the light emitting elements LD to reflect light emitted from the light emitting elements LD, thereby improving light output efficiency of the display panel PNL (refer to FIG. 1).

A second passivation layer PSV2 may be disposed on the color filter layer CFL. The second passivation layer PSV2 may cover a lower member including the color filter layer CFL. The second passivation layer PSV2 may prevent infiltration of moisture or air into the above-described lower member. The second passivation layer PSV2 may protect the above-described lower member from foreign matter such as dust.

In an embodiment, the second passivation layer PSV2 may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the embodiments are not necessarily limited thereto.

In some embodiments, the second passivation layer PSV2 may include an organic material such as acrylates resin, epoxy resin, phenolic resin, polyamides resin, polyimides rein, polyesters resin, polyphenylenesulfides resin, or benzocyclobutene (BCB).

In some embodiments, a light blocking layer BM may be further disposed on the second passivation layer PSV2. The light blocking layer BM may be disposed at a boundary between the first to third pixels PXL1, PXL2, and PXL3. For example, the light blocking layer BM may overlap the bank patterns BNP in the third direction (Z-axis direction). As such, when the light blocking layer BM is formed on the bank patterns BNP, color mixing recognized from the front or side of the display device may be more effectively improved. The material of the light blocking layer BM is not particularly limited, and may include a variety of light blocking materials.

According to the above-described embodiment, the process of manufacturing the display device may be simplified by simultaneously forming the light emitting elements LD and the bank patterns BNP. Since the color filter layer CFL is formed between the bank patterns BNP, in the space or the opening surrounded by the bank patterns BNP, overlay defects may be prevented, thereby effectively improving light leakage and/or color mixing.

Hereinafter, other embodiments will be described. In the following embodiments, the same elements as those already described above are denoted by the same reference numerals, and redundant descriptions will not be repeated.

Figure 5:
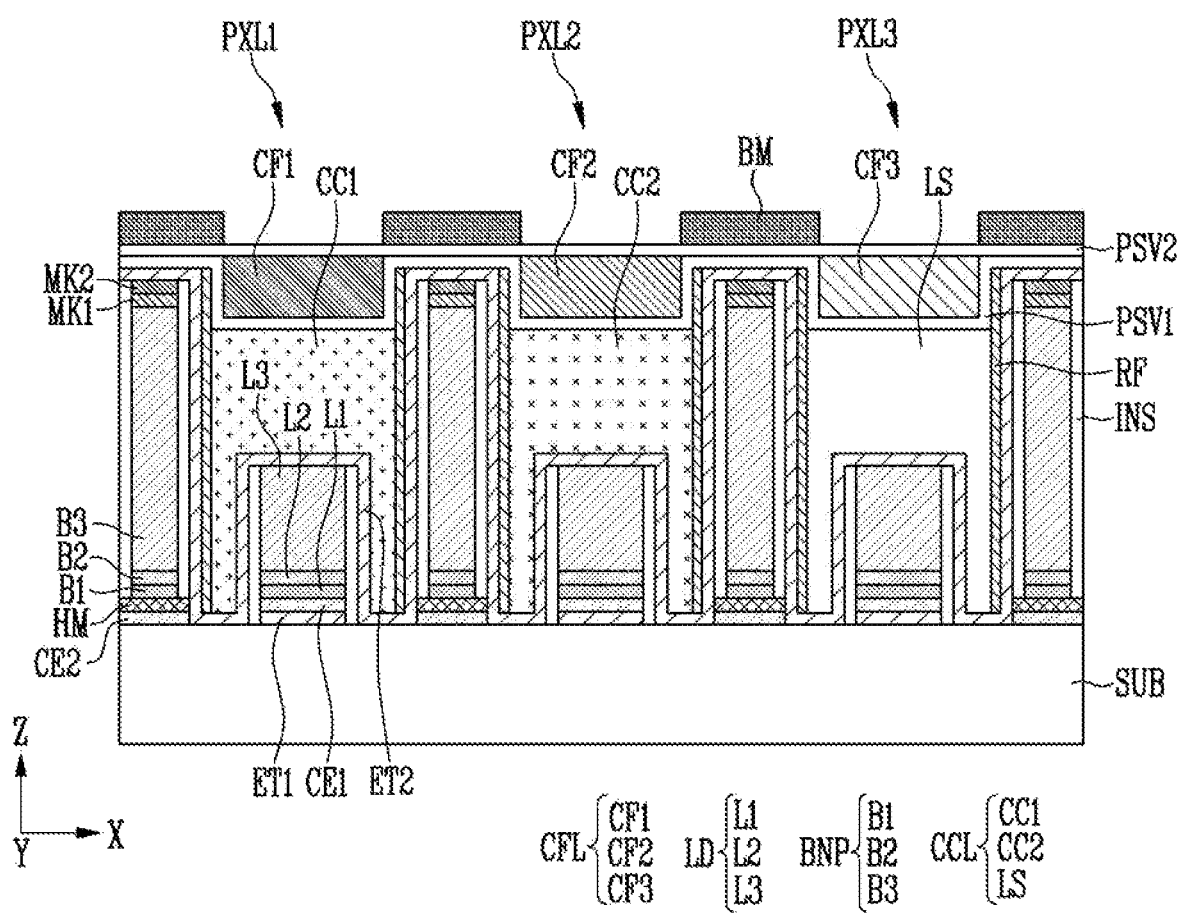
FIG. 5 is a schematic cross-sectional view illustrating a pixel according to an embodiment.

FIG. 5 is a cross-sectional view illustrating a pixel according to an embodiment.

The embodiment of FIG. 5 differs from the embodiments of FIGS. 1 to 3 in that a color conversion layer CCL includes a first color conversion layer CC1 disposed in a first pixel PXL1, a second color conversion layer CC2 disposed in a second pixel PXL2, and a light scattering layer LS disposed in a third pixel PXL3.

In an embodiment, the first to third pixels PXL1, PXL2, and PXL3 may include light emitting elements LD that emit light of the same color. For example, the first to third pixels PXL1, PXL2, and PXL3 may include light emitting elements LD that emit a third color (or blue). Since the color conversion layer CCL including color conversion particles may be disposed on the first to third pixels PXL1, PXL2, and PXL3, full-color images may be displayed.

In an embodiment, when the first pixel PXL1 is a red pixel, the first color conversion layer CC1 may include first quantum dots that convert blue light emitted from the blue light emitting element into red light. The first quantum dots may absorb blue light and shift the wavelength according to an energy transition to emit red light. When the first pixel PXL1 is a pixel of a different color, the first color conversion layer CC1 may include first quantum dots corresponding to the color of the first pixel PXL1.

In an embodiment, when the second pixel PXL2 is a green pixel, the second color conversion layer CC2 may include second quantum dots that convert blue light emitted from the blue light emitting element into green light. The second quantum dots may absorb blue light and shift the wavelength according to an energy transition to emit green light. When the second pixel PXL2 is a pixel of a different color, the second color conversion layer CC2 may include second quantum dots corresponding to the color of the second pixel PXL2.

In an embodiment, blue light having a relatively short wavelength in the visible light band may be incident on the first quantum dots and the second quantum dots, thereby increasing absorption coefficients of the first quantum dots and the second quantum dots. Therefore, the light efficiency and color reproducibility of the first pixel PXL1 and the second pixel PXL2 may be improved. The emission unit EMU of the first to third pixels PXL1, PXL2, and PXL3 is configured using the light emitting elements LD (for example, blue light emitting elements) of the same color, thereby increasing the manufacturing efficiency of the display device.

The light scattering layer LS may be provided to efficiently use the light of the third color (or blue) emitted from the light emitting element LD. For example, when the light emitting element LD is a blue light emitting element that emits blue light and the third pixel PXL3 is a blue pixel, the light scattering layer LS may include light scattering particles to efficiently use light emitted from the light emitting element LD.

For example, the light scattering layer LS may include light scattering particles dispersed in a matrix material such as a base resin. For example, the light scattering layer LS may include light scattering particles such as silica, but the material of the light scattering particles is not limited thereto. On the other hand, the light scattering particles are not selectively disposed only in the third pixel PXL3, but may also be included in the first color conversion layer CC1 or the second color conversion layer CC2. In some embodiments, the light scattering layer LS may be omitted or a transparent polymer may be provided instead of the light scattering layer LS.

Figure 6:
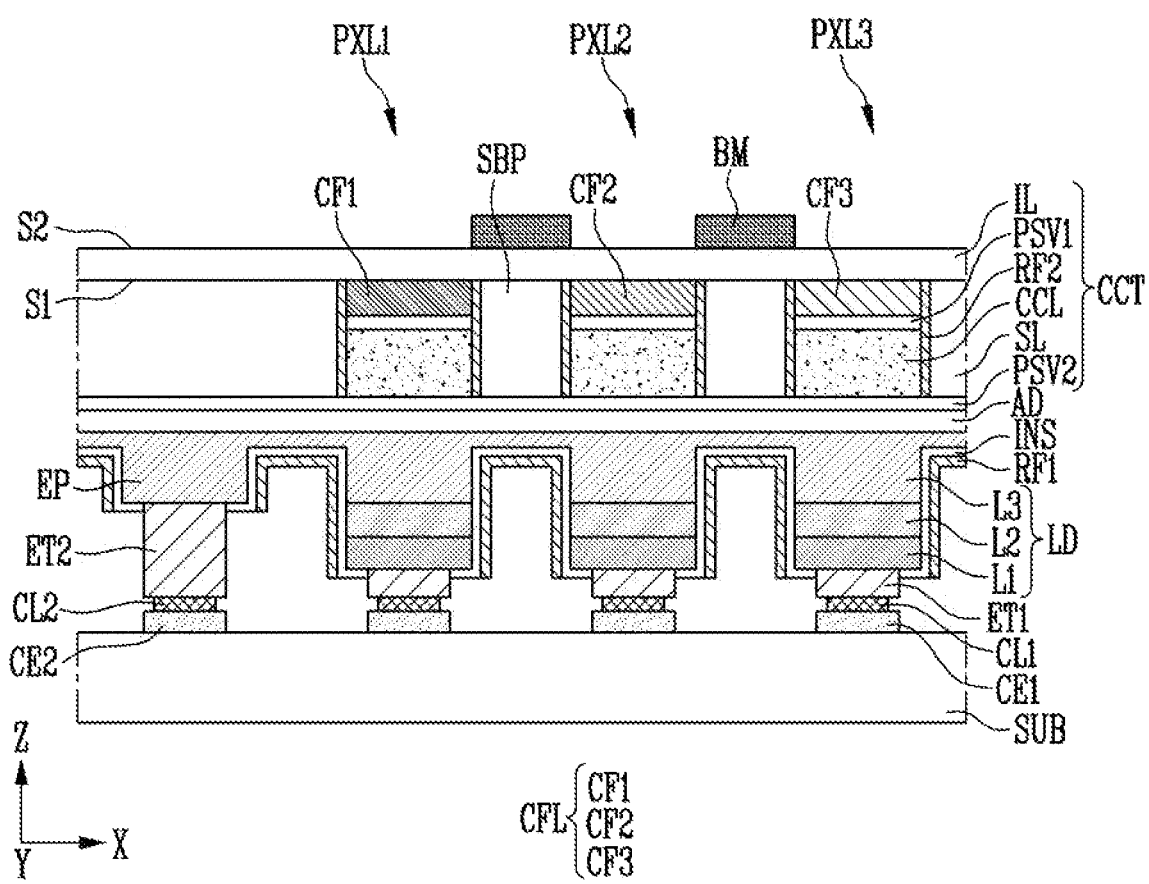
FIG. 6 is a schematic cross-sectional view illustrating a pixel according to an embodiment.

FIG. 6 is a schematic cross-sectional view illustrating a pixel according to an embodiment.

Referring to FIG. 6, a pixel PXL and a display device including the same according to the embodiment may include a substrate SUB, light emitting elements LD disposed on the substrate SUB, and a color control layer CCT disposed on the light emitting elements LD.

The substrate SUB may be a driving substrate including circuit elements including transistors constituting the pixel circuit (PXC of FIG. 2) of each pixel PXL.

The light emitting elements LD may include a first semiconductor layer L1, a second semiconductor layer L3, and an active layer L2 disposed between the first and second semiconductor layers L1 and L3. Since the first semiconductor layer L1, the active layer L2, and/or the second semiconductor layer L3 of the light emitting elements LD have been described with reference to FIG. 3, and the descriptions will not be repeated.

The first semiconductor layer L1 of the light emitting elements LD may be electrically connected to the first connection electrode CE1 provided on the substrate SUB. For example, the first electrode ET1 may be disposed on the first semiconductor layer L1 of the light emitting elements LD, and the first semiconductor layer L1 of the light emitting elements LD may be electrically connected to the first connection electrode CE1 provided on the substrate SUB through the first electrode ET1. In some embodiments, a first connection layer CL1 may be further disposed between the first electrode ET1 and the first connection electrode CE1. As the first electrode ET1 and the first connection electrode CE1 are bonded by the first connection layer CL1, the light emitting elements LD and the substrate SUB may be connected to each other.

A second semiconductor layer L3 of the light emitting elements LD may be electrically connected to a second connection electrode CE2 provided on the substrate SUB. For example, the second semiconductor layer L3 of the light emitting elements LD may be connected to an electrode part EP, and the electrode part EP may be electrically connected to the second connection electrode CE2 provided on the substrate SUB through the second electrode ET2. The electrode part EP and the second semiconductor layer L3 of the light emitting elements LD may be formed integrally with each other, but the embodiments are not limited thereto. In some embodiments, a second connection layer CL2 may be further disposed between the second electrode ET2 and the second connection electrode CE2. As the second electrode ET2 and the second connection electrode CE2 are bonded by the second connection layer CL2, the electrode part EP and the substrate SUB may be connected to each other.

In some embodiments, an insulating film INS may be provided on the light emitting elements LD and/or the electrode part EP. The insulating film INS may be provided on the side surfaces of the light emitting elements LD and/or the electrode part EP. The insulating film INS may prevent an electrical short circuit that may occur when the active layer L2 of the light emitting elements LD contacts a conductive material other than the first and second semiconductor layers L1 and L3. The insulating film INS may minimize surface defects of the light emitting element LD, thereby improving the lifespan and light emission efficiency of the light emitting element LD.

The insulating film INS may cover the side surfaces of the light emitting elements LD and/or the electrode part EP, and may be partially removed to expose the upper surfaces of the light emitting elements LD and/or the electrode part EP. For example, the insulating film INS may be partially removed to expose the first semiconductor layer L1 of the light emitting elements LD.

In some embodiments, a first reflective layer RF1 may be disposed on the insulating film INS. For example, the first reflective layer RF1 may be disposed on the side surfaces of the light emitting elements LD and/or the electrode part EP, and may expose the upper surfaces of the light emitting elements LD and/or the electrode part EP. The first reflective layer RF1 may reflect the light emitted from the light emitting elements LD and guide the light in the third direction (Z-axis direction), towards the front direction of the display panel PNL (refer to FIG. 1), thereby improving light output efficiency. The material of the first reflective layer RF1 is not particularly limited, and may include a variety of reflective materials.

A color control layer CCT may be disposed on the light emitting elements LD. The color control layer CCT may be connected to the light emitting elements LD by at least one adhesive layer AD. The material of the adhesive layer AD is not particularly limited and may include a variety of adhesive materials. However, the embodiments are not limited thereto, and the color control layer CCT and the light emitting elements LD may be formed integrally with each other. For example, the light emitting elements LD may be structures manufactured by stacking or growing on the color control layer CCT and may be directly disposed on the color control layer CCT.

The color control layer CCT may include an insulating layer IL, a silicon layer SL, a color conversion layer CCL, and a color filter layer CFL.

The insulating layer IL may include silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the embodiments are not necessarily limited thereto.

The silicon layer SL may be disposed on a first surface S1 of the insulating layer IL. The silicon layer SL may include bank patterns SBP. The bank patterns SBP may be disposed at a boundary between the first to third pixels PXL1, PXL2, and PXL3 on the first surface S1 of the insulating layer IL.

In some embodiments, the light blocking layer BM may be disposed on a second surface S2 of the insulating layer IL. The second surface S2 of the insulating layer IL is a surface opposite to the first surface S1, and may correspond to a display surface (or a front surface) of the display panel PNL (refer to FIG. 1) in which light is emitted from the pixel PXL.

The light blocking layer BM may be disposed at a boundary between the first to third pixels PXL1, PXL2, and PXL3. The light blocking layer BM may be formed on the bank patterns SBP and may overlap the bank patterns SBP in the third direction (Z-axis direction). In case that the light blocking layer BM is formed on the bank patterns SBP, color mixing recognized from the front or side of the display device may be more effectively improved. The material of the light blocking layer BM is not particularly limited, and may include a variety of light blocking materials.

The color filter layer CFL may be disposed between the bank patterns SBP on the first surface S1 of the insulating layer IL. The color filter layer CFL may be disposed between the side surfaces of the bank patterns SBP. The color filter layer CFL may be provided in a space, or an opening defined by the bank patterns SBP. As such, when the color filter layer CFL is provided in the space surrounded by the bank patterns SBP, it is possible to improve light leakage and/or color mixing caused by overlay defects as described above. Since the color filter layer CFL has been described in detail with reference to FIG. 3 and the like, the descriptions will not be repeated.

A first passivation layer PSV1 may be disposed on the color filter layer CFL. The first passivation layer PSV1 may directly cover the color filter layer CFL. The first passivation layer PSV1 may be disposed in each of the first to third pixels PXL1, PXL2, and PXL3. However, the embodiments are not necessarily limited thereto, and the first passivation layer PSV1 may be disposed over the first to third pixels PXL1, PXL2, and PXL3.

The first passivation layer PSV1 may include silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$).

A color conversion layer CCL may be disposed on the first passivation layer PSV1. The color conversion layer CCL may be disposed between the bank patterns SBP. The color conversion layer CCL may be disposed between the side surfaces of the bank patterns SBP. The color conversion layer CCL may be provided in a space, or an opening defined by the bank patterns SBP.

The color conversion layer CCL may include quantum dots as a color conversion material that may convert light emitted from the light emitting elements LD into light of a different color. Since the color conversion layer CCL has been described in detail with reference to FIG. 3 and the like, the descriptions will not be repeated.

In some embodiments, a second reflective layer RF2 may be disposed between the bank patterns SBP and the color conversion layer CCL and/or the color filter layer CFL. The second reflective layer RF2 may reflect light emitted from the light emitting elements LD to improve light output efficiency of the display panel PNL (refer to FIG. 1). The second reflective layer RF2 may be disposed on the side surfaces of the bank patterns SBP to prevent color mixing between adjacent pixels PXL. The material of the second reflective layer RF2 is not particularly limited, and may include a variety of reflective materials.

A second passivation layer PSV2 may be disposed on the color conversion layer CCL. The second passivation layer PSV2 may directly cover the color conversion layer CCL. The second passivation layer PSV2 may be disposed over the first to third pixels PXL1, PXL2, and PXL3. The second passivation layer PSV2 may cover at least a part of the bank patterns SBP. The second passivation layer PSV2 may prevent impurities such as moisture or air from penetrating from the outside to damage or contaminate the color conversion layer CCL. The second passivation layer PSV2 may be connected to the light emitting elements LD by the above-described adhesive layer AD.

In an embodiment, the second passivation layer PSV2 may include an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the embodiments are not necessarily limited thereto.

In some embodiments, the second passivation layer PSV2 may include an organic material such as acrylates resin, epoxy resin, phenolic resin, polyamides resin, polyimides rein, polyesters resin, polyphenylenesulfides resin, or benzocyclobutene (BCB).

Figure 7:
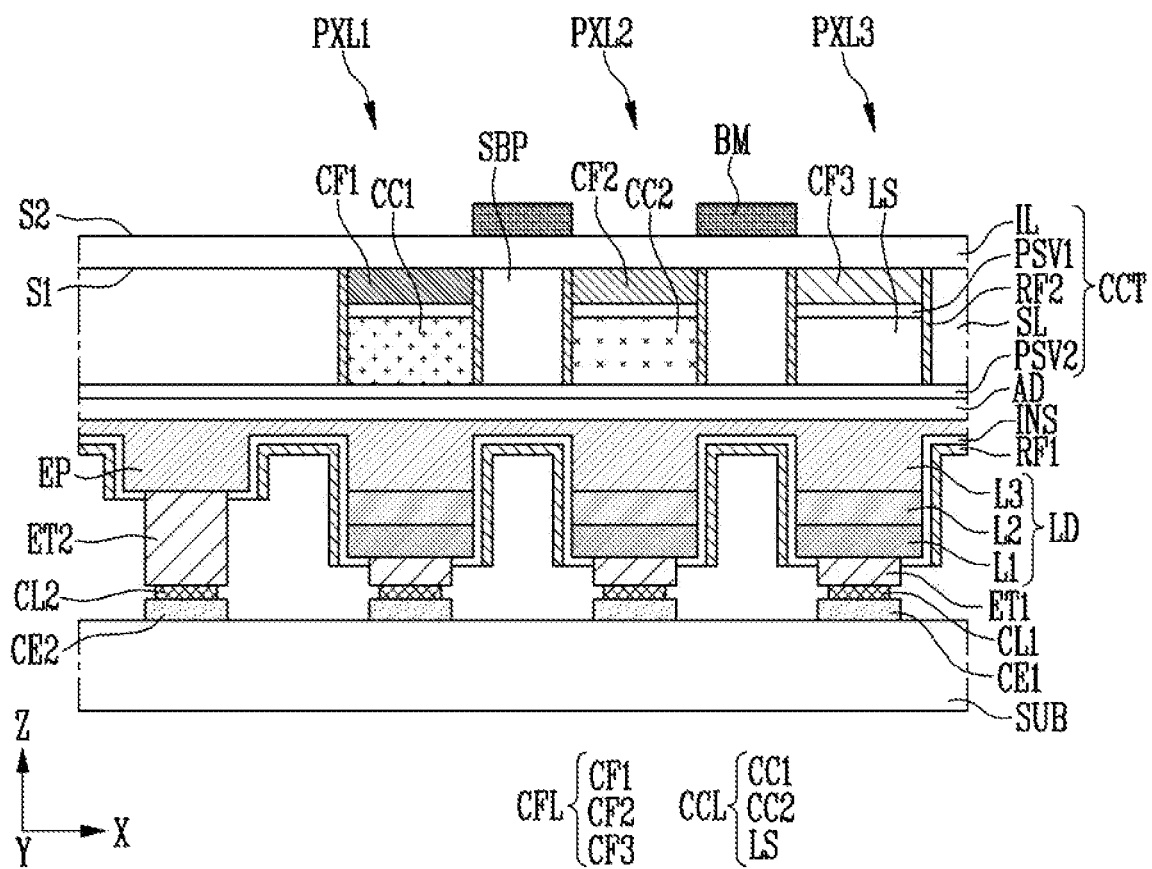
FIG. 7 is a schematic cross-sectional view illustrating a pixel according to an embodiment.

FIG. 7 is a schematic cross-sectional view illustrating a pixel according to an embodiment.

The embodiment of FIG. 7 differs from the embodiment of FIG. 6 in that a color conversion layer CCL includes a first color conversion layer CC1 disposed in a first pixel PXL1, a second color conversion layer CC2 disposed in a second pixel PXL2, and a light scattering layer LS disposed in a third pixel PXL3.

The first to third pixels PXL1, PXL2, and PXL3 may include light emitting elements LD that emit light of the same color. For example, the first to third pixels PXL1, PXL2, and PXL3 may include light emitting elements LD that emit a third color (or blue). Since the color conversion layer CCL including color conversion particles may be disposed on the first to third pixels PXL1, PXL2, and PXL3, full-color images may be displayed.

In an embodiment, when the first pixel PXL1 is a red pixel, the first color conversion layer CC1 may include first quantum dots that convert blue light emitted from the blue light emitting element into red light. The first quantum dots may absorb blue light and shift the wavelength according to an energy transition to emit red light. When the first pixel PXL1 is a pixel of a different color, the first color conversion layer CC1 may include first quantum dots corresponding to the color of the first pixel PXL1.

In an embodiment, when the second pixel PXL2 is a green pixel, the second color conversion layer CC2 may include second quantum dots that convert blue light emitted from the blue light emitting element into green light. The second quantum dots may absorb blue light and shift the wavelength according to an energy transition to emit green light. On the other hand, when the second pixel PXL2 is a pixel of a different color, the second color conversion layer CC2 may include second quantum dots corresponding to the color of the second pixel PXL2.

The light scattering layer LS may be provided to efficiently use the light of the third color (or blue) emitted from the light emitting element LD. For example, when the light emitting element LD is a blue light emitting element that emits blue light and the third pixel PXL3 is a blue pixel, the light scattering layer LS may include light scattering particles to efficiently use light emitted from the light emitting element LD.

Since the first color conversion layer CC1, the second color conversion layer CC2, and the light scattering layer LS have been described in detail with reference to FIG. 5, the descriptions will not be repeated.

Subsequently, a method of manufacturing the display device according to the above-described embodiment will be described.

FIGS. 8 to 25 are schematic cross-sectional views illustrating a method of manufacturing a display device according to an embodiment. FIGS. 8 to 25 are schematic cross-sectional views illustrating a method of manufacturing the display device of FIG. 3, and elements substantially the same as those of FIG. 3 are denoted by the same reference numerals and detailed reference numerals will not be repeated.

Figure 8:
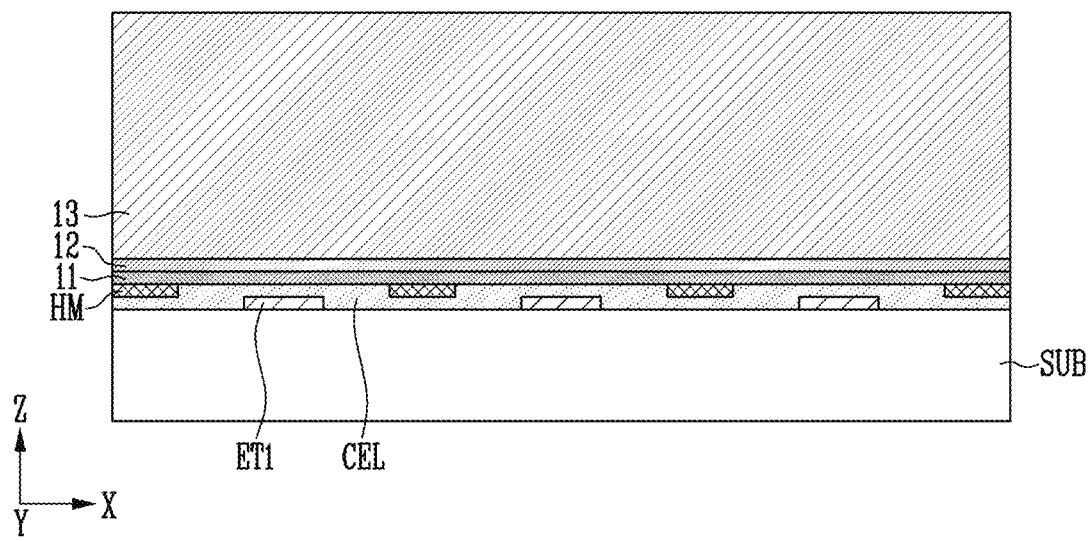
FIGS. 8 to 25 are schematic cross-sectional views illustrating a method of manufacturing a display device according to an embodiment.

Referring to FIG. 8, a substrate SUB may be prepared, and light-emitting stack structures 11, 12, and 13 may be provided on the substrate SUB.

The substrate SUB is a driving substrate including circuit elements including transistors constituting the pixel circuit (PXC of FIG. 2) of each pixel PXL, and a first electrode ET1, a connection electrode layer CEL, and/or a hard mask layer HM may be provided.

The first electrode ET1 may be formed at a position where light emitting elements LD, which will be described later, are provided. A connection electrode layer CEL may be formed over the entire surface of the substrate SUB, but the embodiments are not limited thereto. The hard mask layer HM may be formed at a position where the bank patterns BNP are to be provided so as to form the lower ends of the bank patterns BNP, which will be described later. However, the embodiments are not necessarily limited thereto, and the hard mask layer HM may be omitted in some embodiments.

The light emitting stack structures 11, 12, and 13 may be provided on the substrate SUB. The light emitting stack structures 11, 12, and 13 may be formed by growing seed crystals by an epitaxial method. In some embodiments, the light emitting stack structures 11, 12, and 13 may be formed by metal organic chemical vapor deposition (MOCVD). However, the embodiments are not necessarily limited thereto. The light emitting stack structures 11, 12, and 13 may be formed by a variety of methods such as electron beam deposition, physical vapor deposition (PVD), chemical vapor deposition (CVD), plasma laser deposition (PLD), dual-type thermal evaporation, sputtering, or metal organic chemical vapor deposition (MOCVD).

The light emitting stack structures 11, 12, and 13 may include an epitaxially grown first semiconductor layer 11, an active layer 12, and a second semiconductor layer 13. The first semiconductor layer 11, the active layer 12, and the second semiconductor layer 13 may be sequentially provided in the third direction (Z-axis direction) on the substrate SUB.

The first semiconductor layer 11 may include, for example, at least one p-type semiconductor layer. For example, the first semiconductor layer 11 may include at least one semiconductor material selected from GaN, InAlGaN, AlGaN, InGaN, AlN, and InN, and may include a p-type semiconductor layer doped with a first conductive dopant (or p-type dopant) such as Mg, Zn, Ca, Sr, or Ba. For example, the first semiconductor layer 11 may include a GaN semiconductor material doped with a first conductive dopant (or a p-type dopant), but the embodiments are not necessarily limited thereto, and a variety of materials may form the first semiconductor layer 11.

The active layer 12 may be disposed between the first semiconductor layer 11 and the second semiconductor layer 13. The active layer 12 may include any one of a single well structure, a multi-well structure, a single quantum well structure, a multi-quantum well (MQW) structure, a quantum dot structure, or a quantum wire structure, but the embodiments are not necessarily limited thereto. The active layer 12 may include GaN, InGaN, InAlGaN, AlGaN, AlN, or the like. A variety of materials may form the active layer 12.

In some embodiments, an electron blocking layer (not illustrated) may be further disposed between the active layer 12 and the first semiconductor layer 11. The electron blocking layer may block the flow of electrons supplied from the second semiconductor layer 13 from escaping to the first semiconductor layer 11, thereby increasing the electron-hole recombination probability in the active layer 12. The energy bandgap of the electron blocking layer may be greater than the energy bandgap of the active layer 12 and/or the first semiconductor layer 11, but the embodiments are not limited thereto.

In some embodiments, a superlattice layer (not illustrated) may be further disposed between the active layer 12 and the second semiconductor layer 13. The superlattice layer relieves the stress of the active layer 12 and the second semiconductor layer 13 to improve the quality of the light emitting elements LD. For example, the superlattice layer may be formed in a structure in which InGaN and GaN are alternately stacked, but the embodiments are not limited thereto.

The second semiconductor layer 13 may be disposed on the active layer 12, and may include a semiconductor layer of a different type from the first semiconductor layer 11. In an embodiment, the second semiconductor layer 13 may include at least one n-type semiconductor layer. For example, the second semiconductor layer 13 may include one semiconductor material selected from GaN, InAlGaN, AlGaN, InGaN, AlN, and InN, and may be an n-type semiconductor layer to which a first conductive dopant (or n-type dopant) such as Si, Ge, or Sn is doped. For example, the second semiconductor layer 13 may include a GaN semiconductor material doped with a second conductive dopant (or an n-type dopant). However, the material forming the second semiconductor layer 13 is not limited thereto, and the second semiconductor layer 13 may include a variety of other materials.

Figure 9:
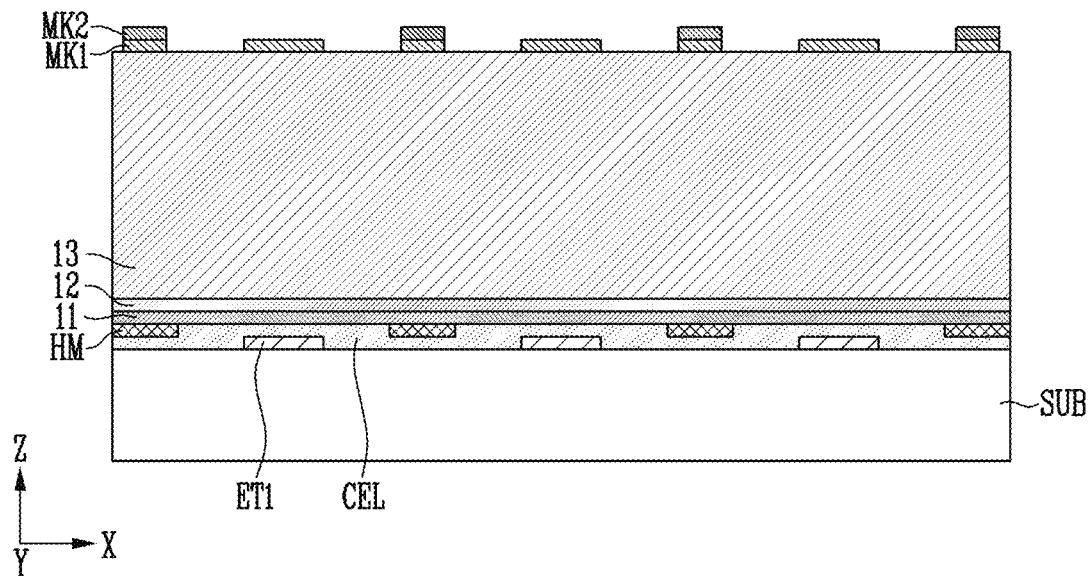

Referring to FIG. 9, first and second mask layers MK1 and MK2 may be formed on the light emitting stack structures 11, 12, and 13.

The first mask layer MK1 may be partially formed at a position where light emitting elements LD and bank patterns BNP, which will be described later, are provided. The second mask layer MK2 may be formed on the first mask layer MK1. The second mask layer MK2 may be selectively formed at positions where the bank patterns BNP are to be provided.

The first mask layer MK1 and the second mask layer MK2 may be formed of different materials. For example, the first mask layer MK1 may include silicon oxide ($SiO_x$) and the second mask layer MK2 may include nickel (Ni), but the embodiments are not limited thereto.

Figure 10:
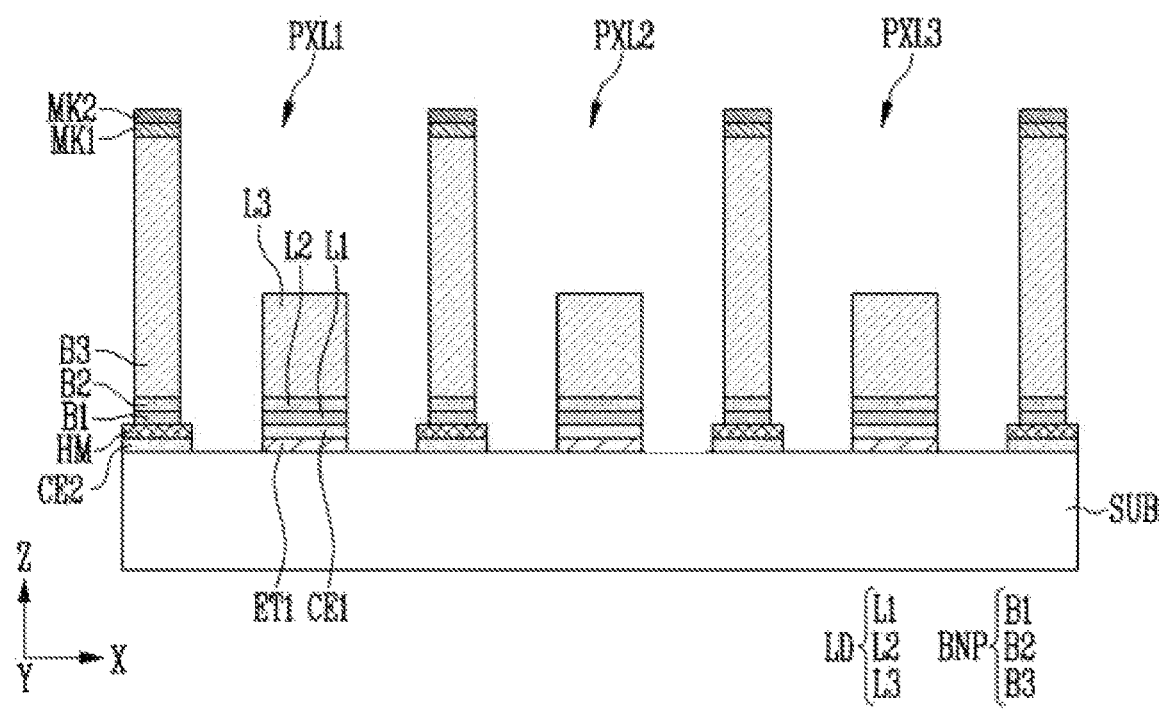

Referring to FIG. 10, the light emitting stack structures 11, 12, and 13 may be patterned to form light emitting elements LD and bank patterns BNP. The bank patterns BNP may be formed at a boundary between the first to third pixels PXL1, PXL2, and PXL3. The light emitting elements LD may be respectively formed in the first to third pixels PXL1, PXL2, and PXL3 between the bank patterns BNP.

In the process of patterning the light emitting stack structures 11, 12, and 13, the bank patterns BNP and the light emitting elements LD having different thicknesses may be simultaneously formed using the difference in the etch selectivity of the first mask layer MK1 and the second mask layer MK2.

In some embodiments, in the process of patterning the light emitting stack structures 11, 12, and 13, the connection electrode layer CEL may be separated into the first connection electrode CE1 and the second connection electrode CE2. For example, the connection electrode layer CEL may be separated into the first connection electrode CE1 under the light emitting elements LD and the second connection electrode CE2 under the hard mask layer HM.

Figure 11:
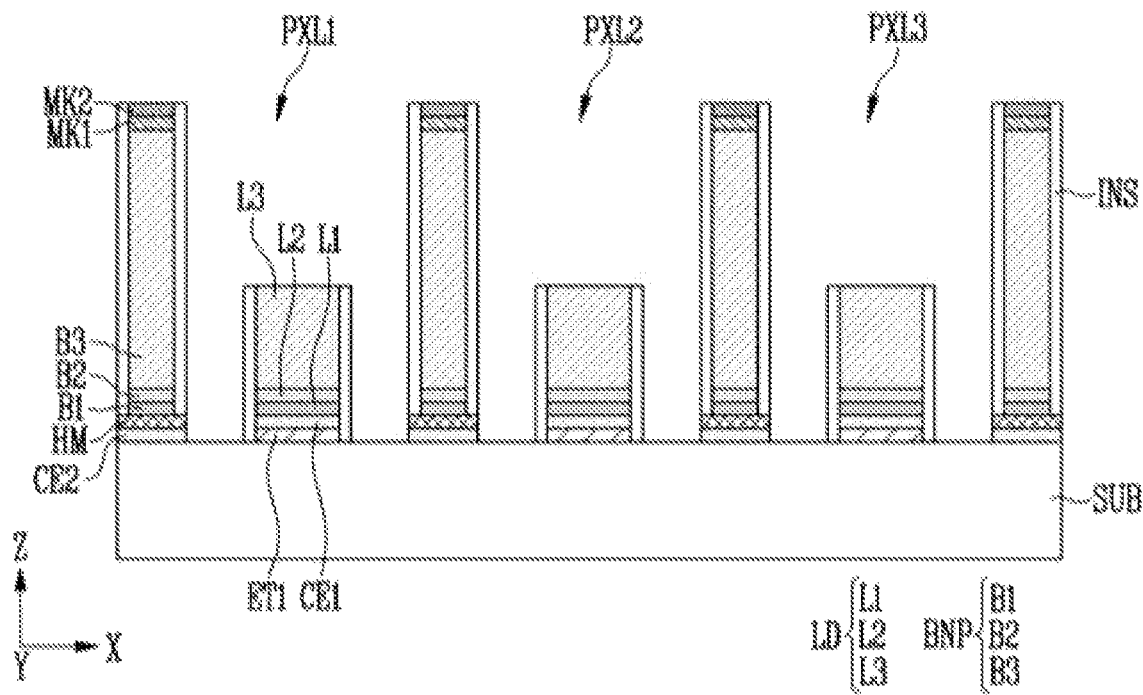

Referring to FIG. 11, an insulating film INS may be formed on the light emitting elements LD and/or the bank patterns BNP. The insulating film INS may be partially formed on the side surfaces of the light emitting elements LD and/or the bank patterns BNP. After the insulating film INS is formed over the first to third pixels PXL1, PXL2, and PXL3, the insulating film INS may be partially removed to expose the upper surfaces of the light emitting elements LD and/or the bank patterns BNP. In an embodiment, when the light emitting elements LD and/or the bank patterns BNP may be formed in the third direction (Z-axis direction) that is perpendicular to the substrate SUB, the insulating film INS provided on the upper surfaces of the light emitting elements LD and/or the bank patterns BNP may be etched without a separate mask during an etching process.

Figure 12:
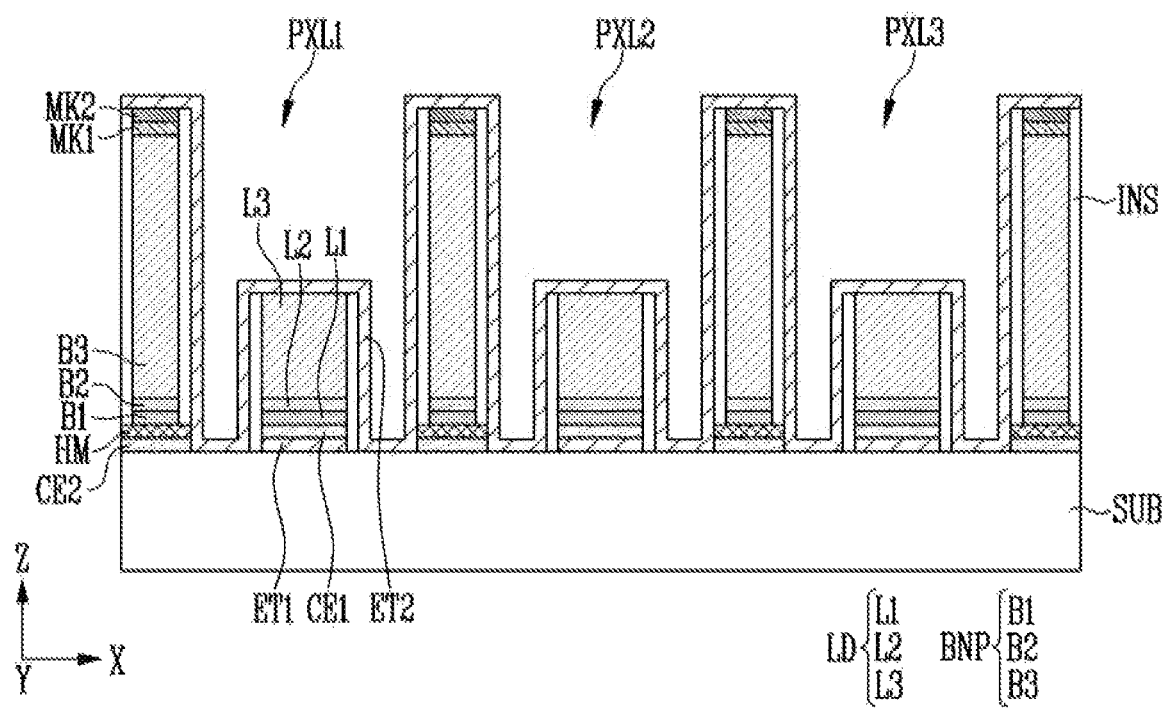

Referring to FIG. 12, a second electrode ET2 may be formed on the light emitting elements LD. The second electrode ET2 may be directly formed on the upper surface of the light emitting elements LD exposed by the insulating film INS and may contact the second semiconductor layer L3 of the light emitting elements LD.

The second electrode ET2 may be formed over the first to third pixels PXL1, PXL2, and PXL3. The second electrode ET2 may be formed to cover at least a part of the bank patterns BNP, but the embodiments are not limited thereto.

The second electrode ET2 may be formed of a variety of transparent conductive materials. For example, the second electrode ET2 may be formed of at least one of the transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent so as to satisfy a level of light transmittance. Therefore, the light emitted from the light emitting elements LD may pass through the second electrode ET2 and may be emitted to the outside of the display panel PNL (refer to FIG. 1).

Figure 13:
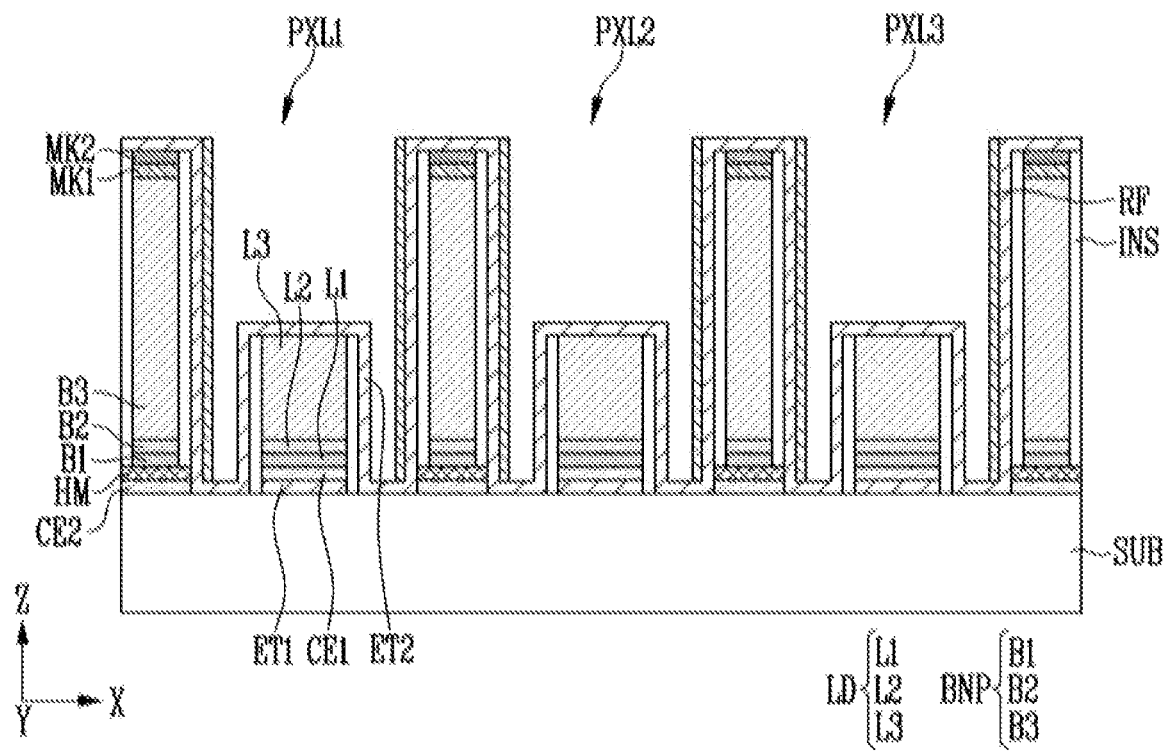

Referring to FIG. 13, a reflective layer RF may be formed on the bank patterns BNP. The reflective layer RF may be partially formed on the side surfaces of the bank patterns BNP. The reflective layer RF may reflect light emitted from the light emitting elements LD to improve light output efficiency of the display panel PNL (refer to FIG. 1). The reflective layer RF may be disposed on the side surfaces of the bank patterns BNP to prevent color mixing between adjacent pixels PXL. The material of the reflective layer RF is not particularly limited, and may include a variety of reflective materials. In some embodiments, after the reflective layer RF is formed over the first to third pixels PXL1, PXL2, and PXL3, the reflective layer RF may be partially etched. As described with reference to FIG. 4, the reflective layer RF may also be partially formed on the side surfaces of the light emitting elements LD.

Figure 14:
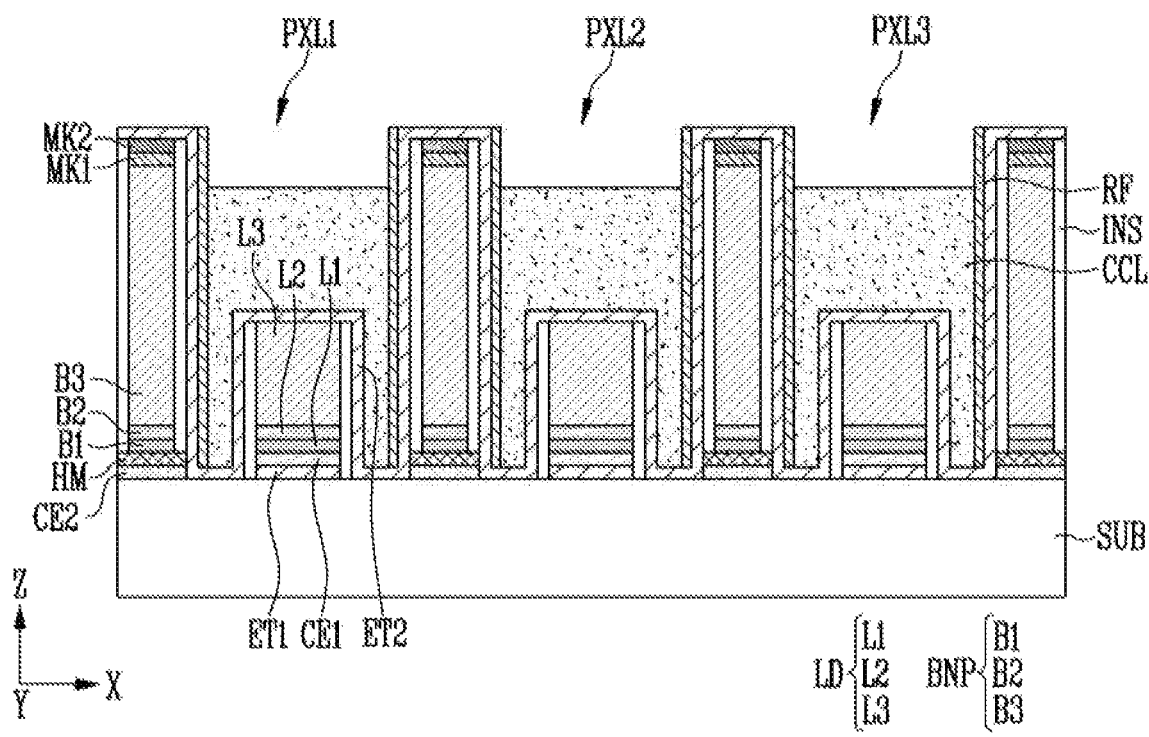

Referring to FIG. 14, a color conversion layer CCL may be formed on the light emitting elements LD. The color conversion layer CCL may be formed between the bank patterns BNP. The color conversion layer CCL may be formed between the side surfaces of the bank patterns BNP on the light emitting elements LD. The color conversion layer CCL may be formed in a space, or an opening defined by the bank patterns BNP.

The color conversion layer CCL may include quantum dots as a color conversion material that converts light emitted from the light emitting elements LD of each pixel PXL into light of a different color. Since the color conversion layer CCL has been described in detail with reference to FIG. 3 and the like, the descriptions will not be repeated.

Figure 15:
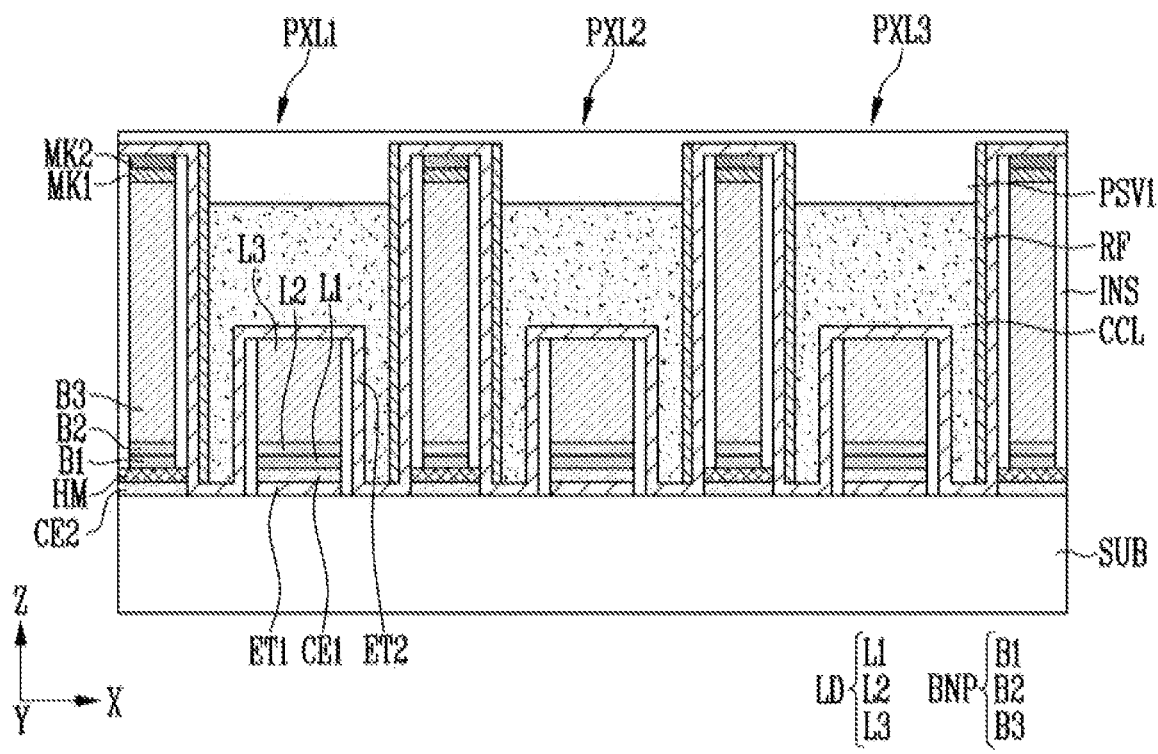

Referring to FIG. 15, a first passivation layer PSV1 may be formed on the color conversion layer CCL. The first passivation layer PSV1 may planarize the step difference of the color conversion layer CCL.

The first passivation layer PSV1 may be formed of an organic material such as acrylates resin, epoxy resin, phenolic resin, polyamides resin, polyimides rein, polyesters resin, polyphenylenesulfides resin, or benzocyclobutene (BCB). However, the embodiments are not necessarily limited thereto, and the first passivation layer PSV1 may be formed of an inorganic material such as silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$).

In some embodiments, after the first passivation layer PSV1 may be formed over the first to third pixels PXL1, PXL2, and PXL3, a planarization process may be performed through chemical mechanical polish (CMP). However, the process of forming the first passivation layer PSV1 is not necessarily limited thereto, and may be provided by a variety of methods.

Figure 16:
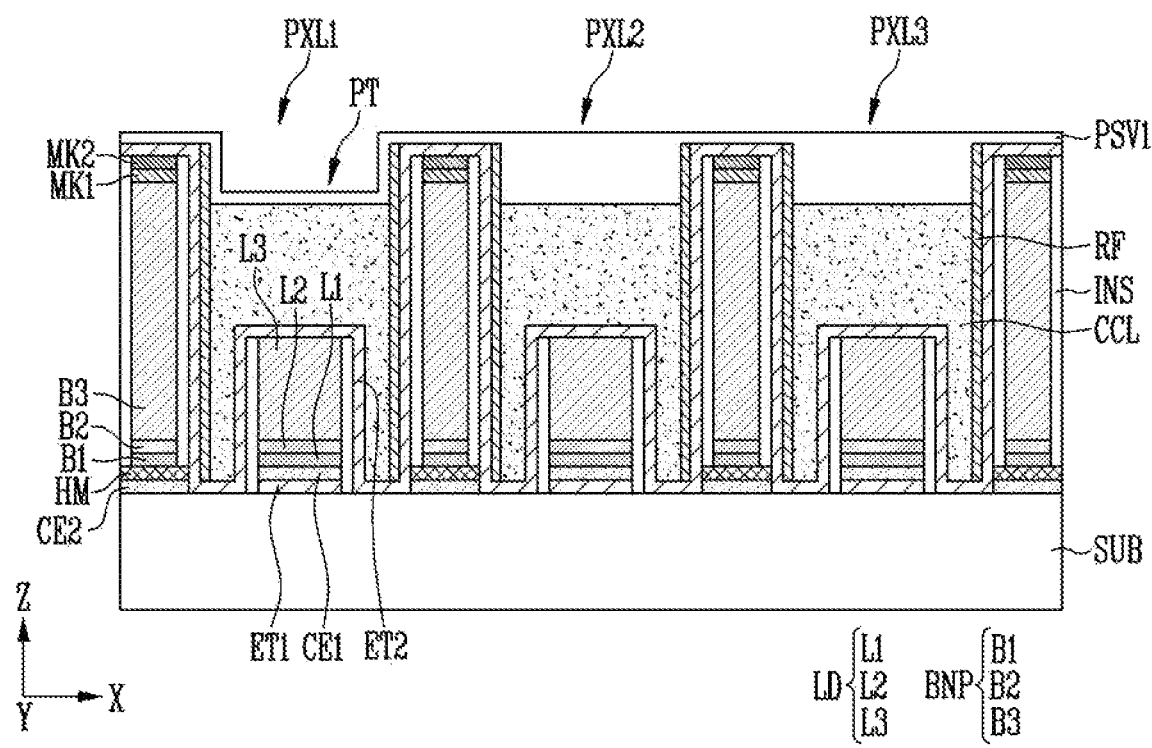

Referring to FIG. 16, the first passivation layer PSV1 may be patterned to form groove patterns PT in the first pixel PXL1. Since the groove patterns PT of the first pixel PXL1 are formed between the bank patterns BNP, the groove patterns PT may overlap the light emitting elements LD of the first pixel PXL1 in the third direction (Z-axis direction).

Figure 17:
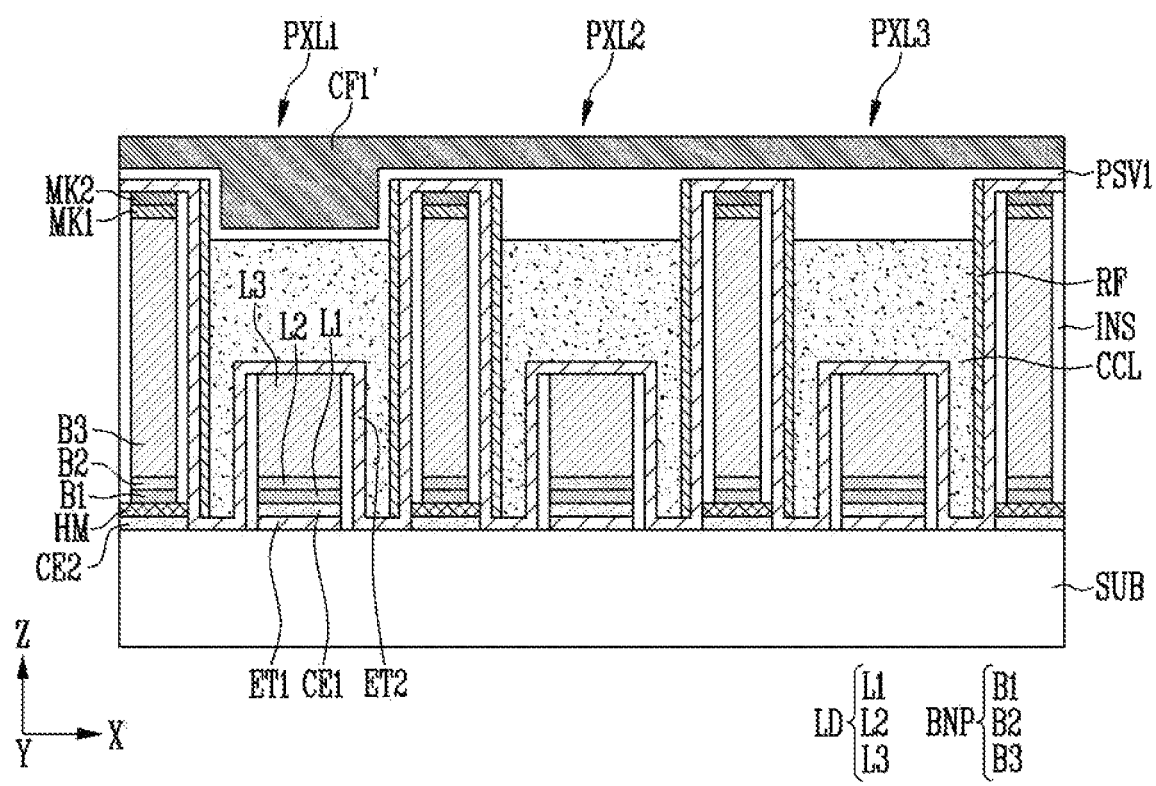

Referring to FIG. 17, a first color filter material layer CF1' may be formed on the first passivation layer PSV1. In an embodiment, the first color filter material layer CF1' may be provided on the first passivation layer PSV1 and formed in the groove pattern PT of the first pixel PXL1. In some embodiments, the first color filter material layer CF1' may also be formed on the first passivation layer PSV1 of the second pixel PXL2 and/or the third pixel PXL3.

The first color filter material layer CF1' may include a color filter material that selectively transmits light of a first color (or red). For example, when the first pixel PXL1 is a red pixel, the first color filter material layer CF1' may include a red color filter material. For example, the first color filter material layer CF1' may be a photoresist including a red color filter material, but the embodiments are not necessarily limited thereto.

Figure 18:
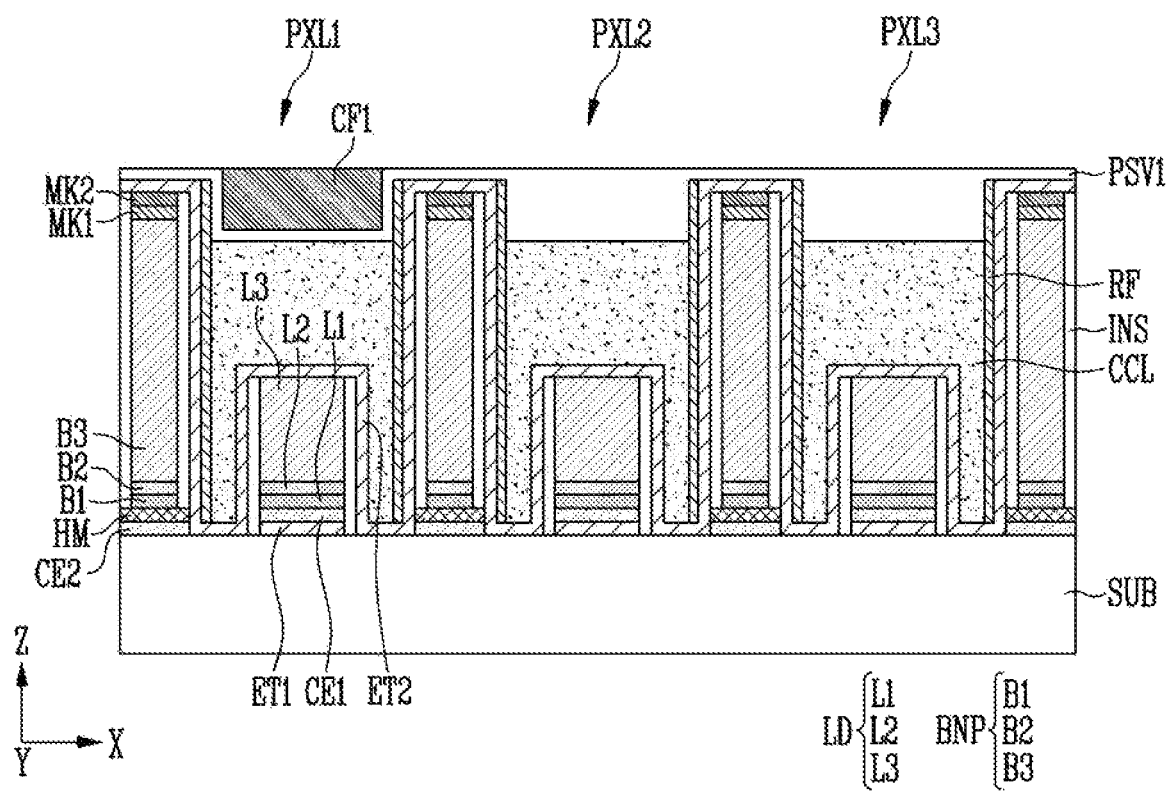

Referring to FIG. 18, at least a portion of the first color filter material layer CF1' may be removed to form a first color filter CF1. For example, the first color filter material layer CF1' formed in the second pixel PXL2 and/or the third pixel PXL3 may be removed through chemical mechanical polishing (CMP). During the polishing process, the first color filter material layer CF1' provided on the bank patterns BNP adjacent to the first pixel PXL1 may also be partially removed. Therefore, the first color filter CF1 may be selectively formed only inside the groove pattern PT of the first pixel PXL1. However, the process of forming the first color filter CF1 is not necessarily limited thereto, and may be provided by a variety of methods.

Figure 19:
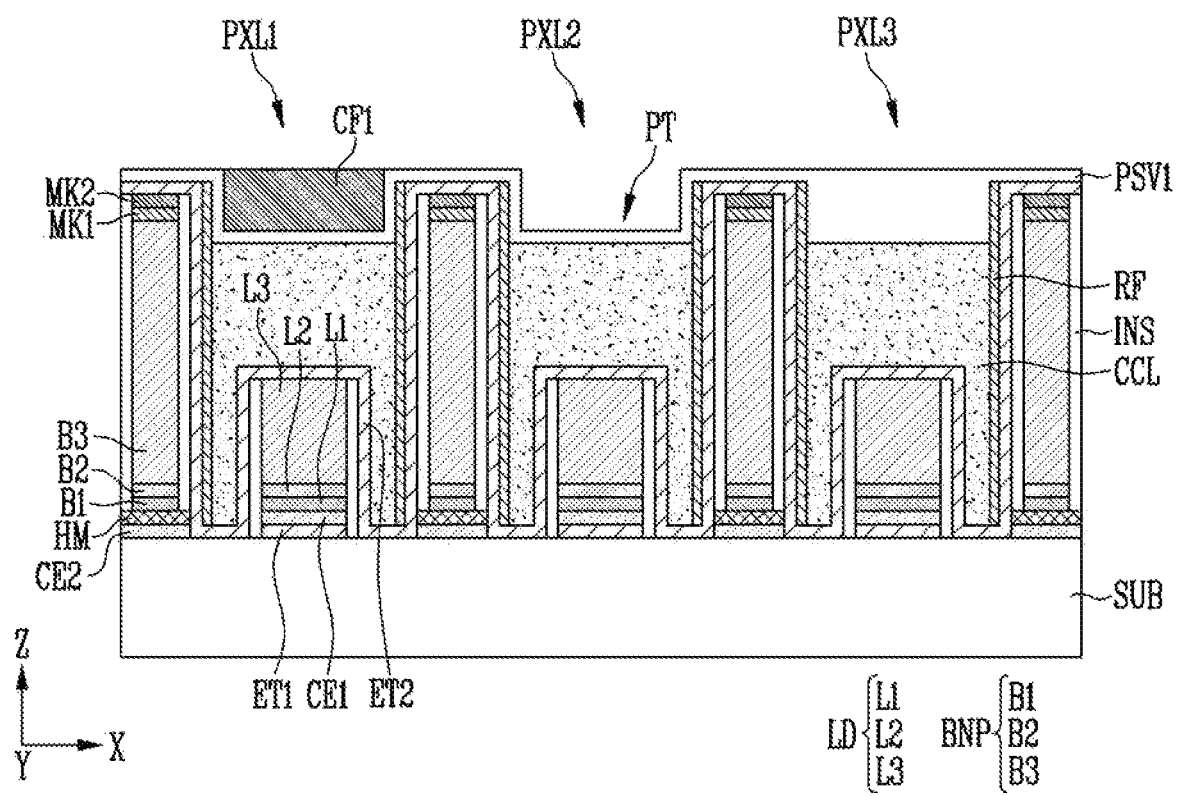

Referring to FIG. 19, the first passivation layer PSV1 may be patterned to form groove patterns PT in the second pixel PXL2. Since the groove patterns PT of the second pixel PXL2 are formed between the bank patterns BNP, the groove patterns PT may overlap the light emitting elements LD of the second pixel PXL2 in the third direction (Z-axis direction).

Figure 20:
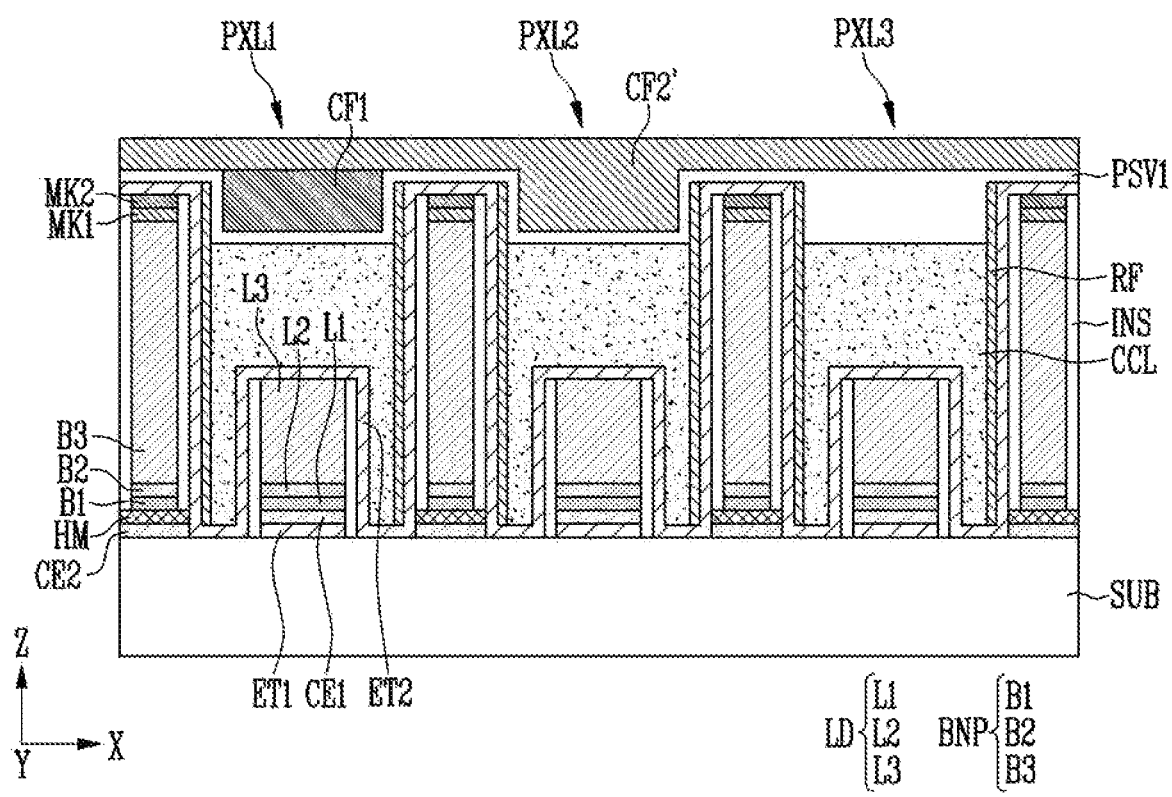

Referring to FIG. 20, a second color filter material layer CF2' may be formed on the first passivation layer PSV1. In an embodiment, the second color filter material layer CF2' may be provided on the first passivation layer PSV1 and formed in the groove pattern PT of the second pixel PXL2. In some embodiments, the second color filter material layer CF2' may also be formed on the first passivation layer PSV1 of the first pixel PXL1 and/or the third pixel PXL3.

The second color filter material layer CF2' may include a color filter material that selectively transmits light of a second color (or green). For example, when the second pixel PXL2 is a green pixel, the second color filter material layer CF2' may include a green color filter material. For example, the second color filter material layer CF2' may be a photoresist including a green color filter material, but the embodiments are not necessarily limited thereto.

Figure 21:
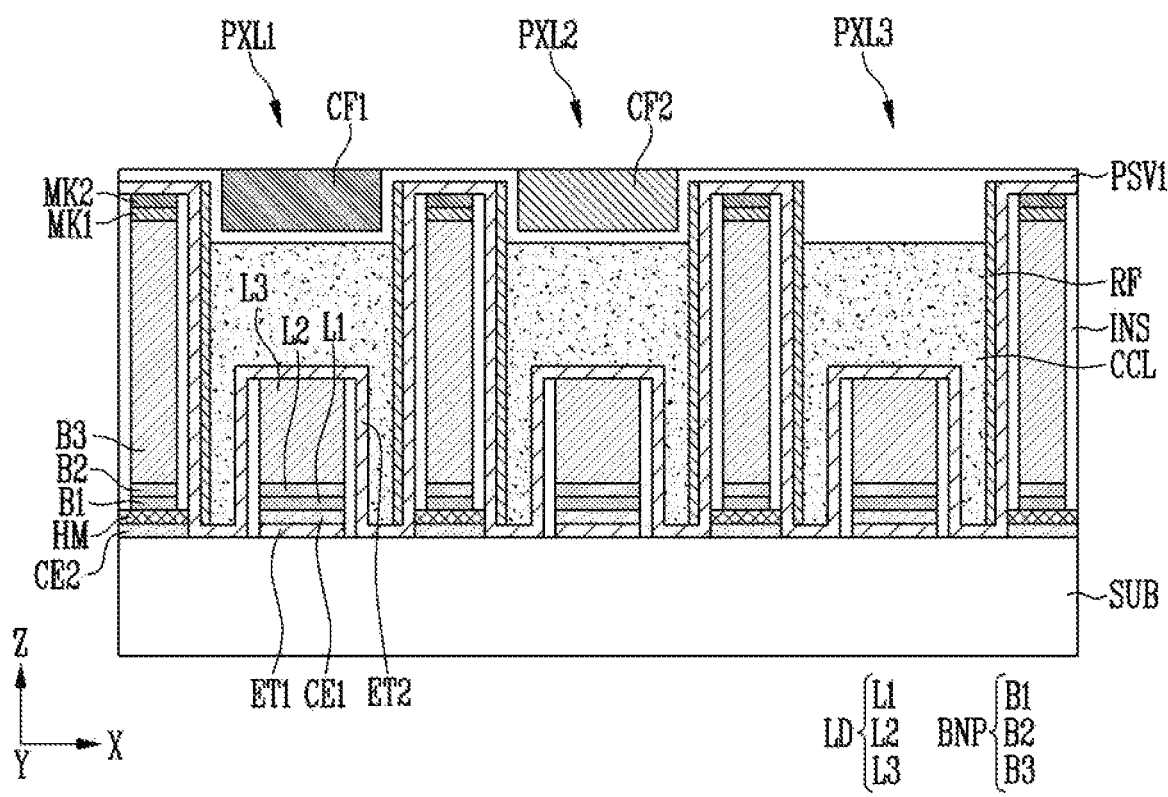

Referring to FIG. 21, at least a portion of the second color filter material layer CF2' may be removed to form a second color filter CF2. For example, the second color filter material layer CF2' disposed in the first pixel PXL1 and/or the third pixel PXL3 may be removed through chemical mechanical polishing (CMP). During the polishing process, the second color filter material layer CF2' provided on the bank patterns BNP adjacent to the second pixel PXL2 may also be partially removed. Therefore, the second color filter CF2 may be selectively formed only inside the groove pattern PT of the second pixel PXL2. However, the process of forming the second color filter CF2 is not necessarily limited thereto, and may be provided by a variety of methods.

Figure 22:
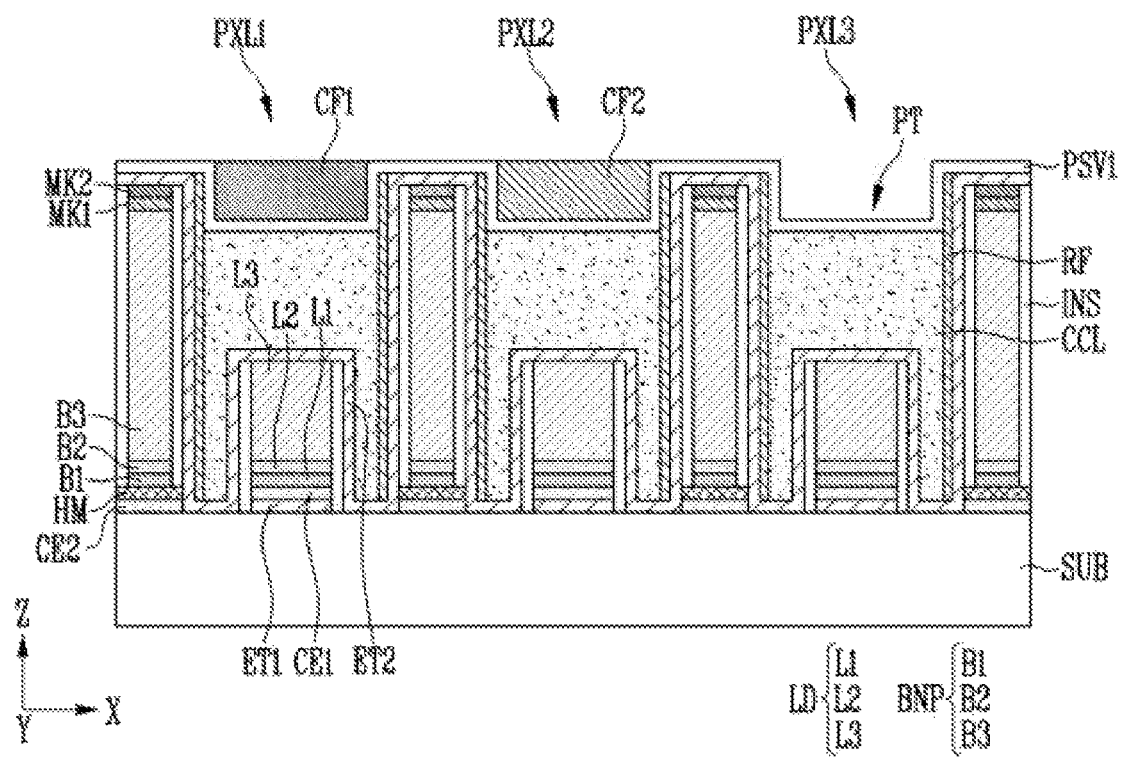

Referring to FIG. 22, the first passivation layer PSV1 may be patterned to form groove patterns PT in the third pixel PXL3. Since the groove patterns PT of the third pixel PXL3 are formed between the bank patterns BNP, the groove patterns PT may overlap the light emitting elements LD of the third pixel PXL3 in the third direction (Z-axis direction).

Figure 23:
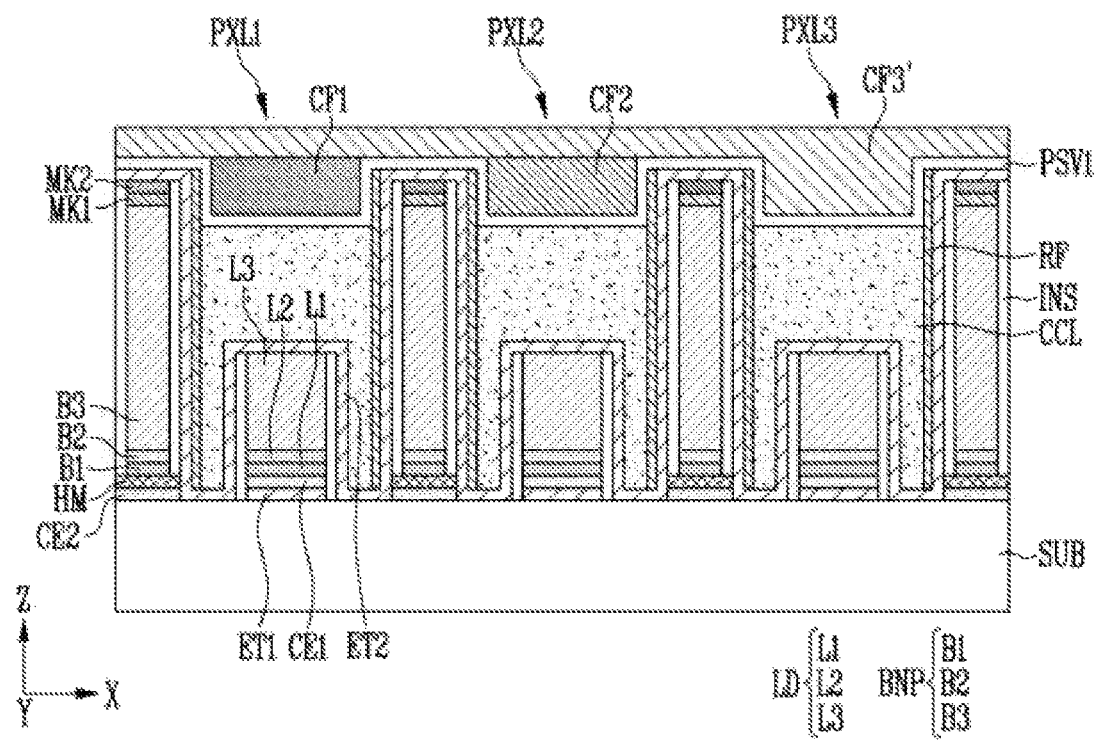

Referring to FIG. 23, a third color filter material layer CF3' may be formed on the first passivation layer PSV1. In an embodiment, the third color filter material layer CF3' may be provided on the first passivation layer PSV1 and formed in the groove pattern PT of the third pixel PXL3. In some embodiments, the third color filter material layer CF3' may also be formed on the first passivation layer PSV1 of the first pixel PXL1 and/or the second pixel PXL2.

The third color filter material layer CF3' may include a color filter material that selectively transmits light of a third color (or blue). For example, when the third pixel PXL3 is a blue pixel, the third color filter material layer CF3' may include a blue color filter material. For example, the third color filter material layer CF3' may be a photoresist including a blue color filter material, but the embodiments are not necessarily limited thereto.

Figure 24:
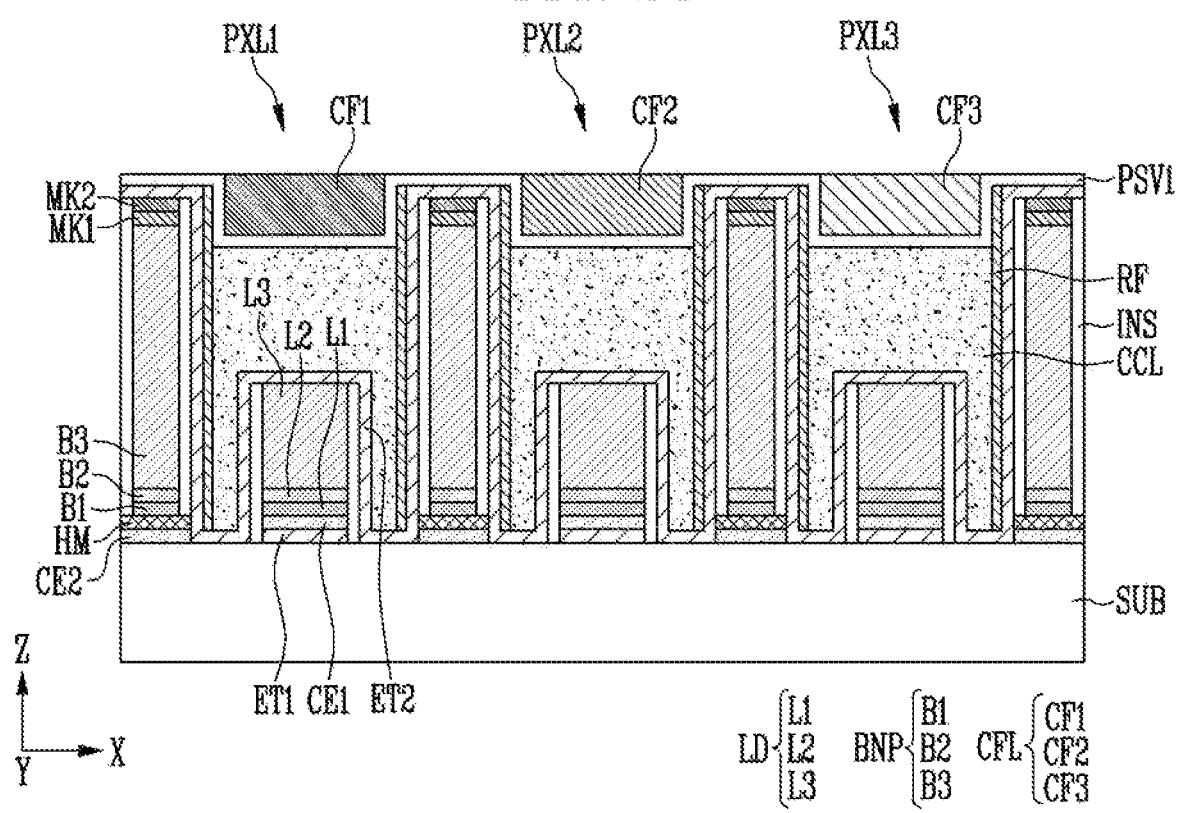

Referring to FIG. 24, at least a portion of the third color filter material layer CF3' is removed to form a third color filter CF3. For example, the third color filter material layer CF3' disposed in the first pixel PXL1 and/or the second pixel PXL2 may be removed through chemical mechanical polishing (CMP). During the polishing process, the third color filter material layer CF3' provided on the bank patterns BNP adjacent to the third pixel PXL3 may also be partially removed. Therefore, the third color filter CF3 may be selectively formed only inside the groove pattern PT of the third pixel PXL3. However, the process of forming the third color filter CF3 is not necessarily limited thereto, and may be provided by a variety of methods.

Figure 25:
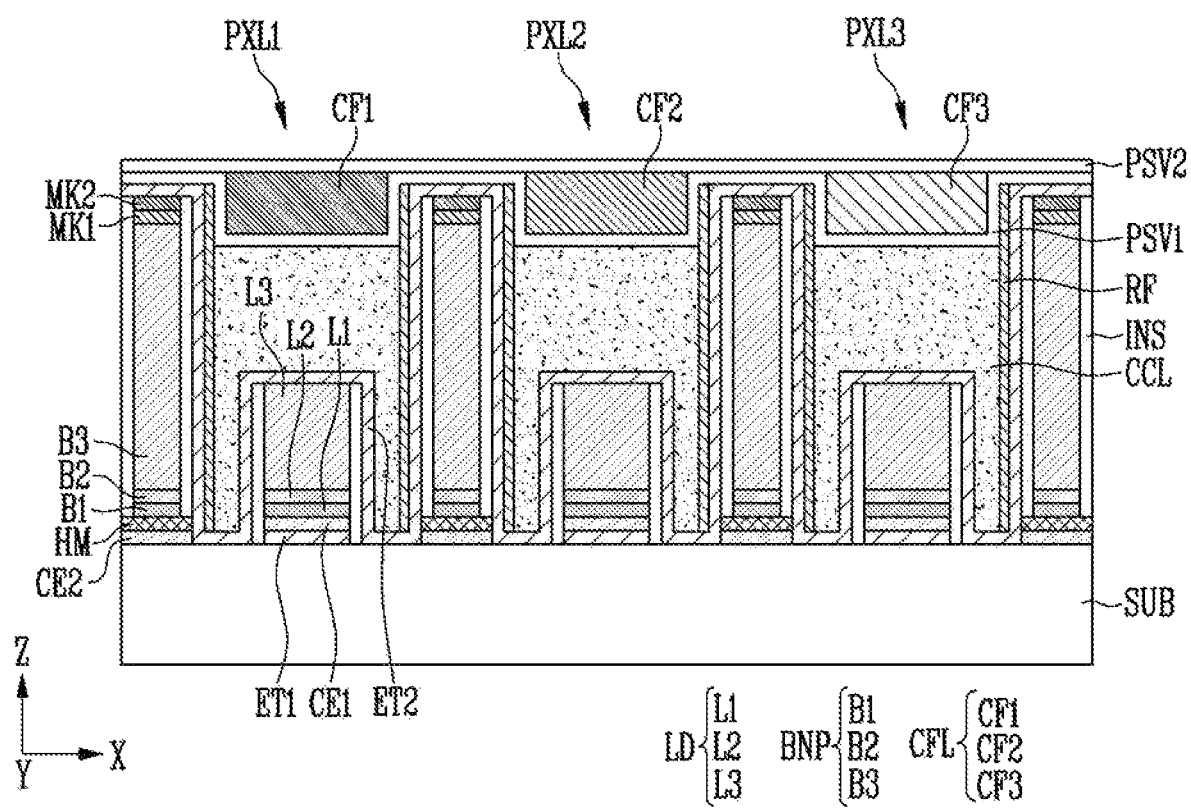

Referring to FIG. 25, a second passivation layer PSV2 may be formed on the color filter layer CFL. Since the second passivation layer PSV2 has been described in detail with reference to FIG. 3 and the like, descriptions will not be repeated.

Subsequently, the light blocking layer BM (refer to FIG. 3) may be formed on the second passivation layer PSV2 to complete the display device of FIG. 3. The light blocking layer BM may be partially formed at a boundary between the first to third pixels PXL1, PXL2, and PXL3. For example, the light blocking layer BM may be formed on the bank patterns BNP to overlap the bank patterns BNP in the third direction (Z-axis direction). When the light blocking layer BM is formed on the bank patterns BNP, color mixing recognized from the front or side of the display device may be more effectively improved.

According to the above-described embodiment, the process of manufacturing the display device may be simplified by simultaneously forming the light emitting elements LD and the bank patterns BNP. Since the color filter layer CFL is formed between the bank patterns BNP that is in the space or the opening surrounded by the bank patterns BNP, overlay defects may be prevented, thereby effectively improving light leakage and/or color mixing.

Hereinafter, other embodiments will be described. In the following embodiments, the same elements as those already described above are denoted by the same reference numerals, and redundant descriptions thereof will not be repeated.

FIGS. 26 to 37 are schematic cross-sectional views illustrating a method of manufacturing a display device according to another embodiment. FIGS. 26 to 37 are schematic cross-sectional views illustrating a method of manufacturing the display device of FIG. 6, and elements substantially the same as those of FIG. 6 are denoted by the same reference numerals and detailed reference numerals are omitted.

Figure 26:
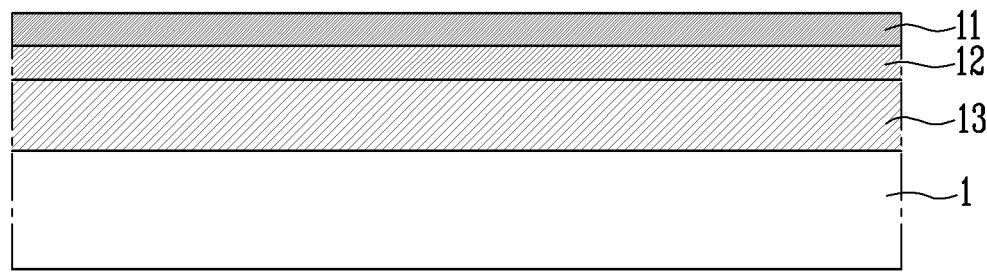
FIGS. 26 to 37 are schematic cross-sectional views illustrating a method of manufacturing a display device according to an embodiment.
Figure 26:
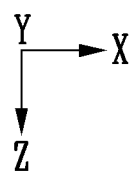

Referring to FIG. 26, a stack substrate 1 may be prepared, and light-emitting stack structures 11, 12, and 13 may be provided on the stack substrate 1. The stack substrate 1 may use a silicon wafer, but the embodiments are not limited thereto.

The light emitting stack structures 11, 12, and 13 may include an epitaxially grown first semiconductor layer 11, an active layer 12, and a second semiconductor layer 13. The second semiconductor layer 13, the active layer 12, and the first semiconductor layer 11 may be sequentially provided on the stack substrate 1 in the third direction (Z-axis direction). Since the light-emitting stack structures 11, 12, and 13 have already been described with reference to FIG. 8 and the like, the descriptions will not be repeated.

Figure 27:
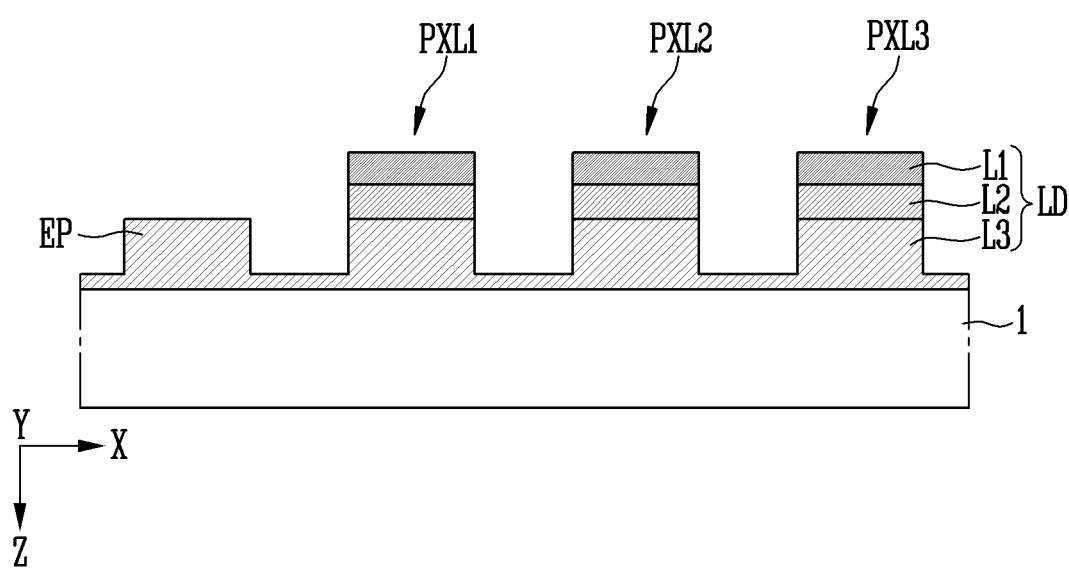

Referring to FIG. 27, the light emitting stack structures 11, 12, and 13 may be patterned to form light emitting elements LD and/or an electrode part EP. The light emitting elements LD may be respectively formed in the first to third pixels PXL1, PXL2, and PXL3. The electrode part EP may be formed around the pixels PXL. The electrode part EP may be integrally formed with the second semiconductor layer L3 of the light emitting elements LD, but the embodiments are not limited thereto.

Figure 28:
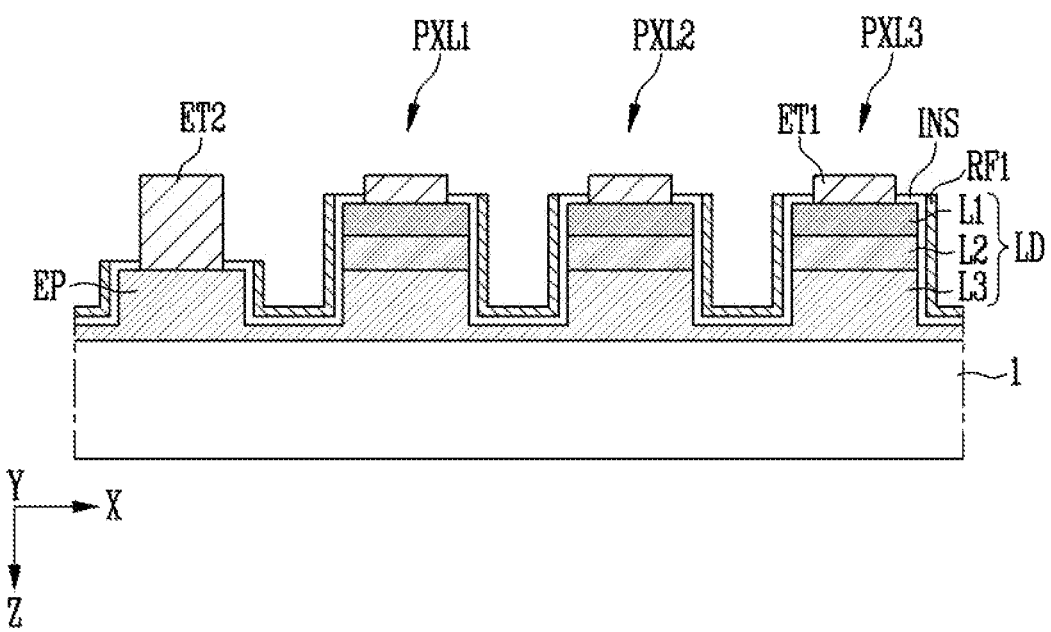

Referring to FIG. 28, a first electrode ET1, a second electrode ET2, an insulating film INS, and/or a first reflective layer RF1 may be formed on the light emitting elements LD and/or the electrode part EP.

The first electrode ET1 may be formed on the first semiconductor layer L1 of the light emitting elements LD. The second electrode ET2 may be formed on the electrode part EP. The first electrode ET1 and the second electrode ET2 may be formed of a same material. The first electrode ET1 and the second electrode ET2 may be simultaneously formed in the same process, but the embodiments are not limited thereto.

The insulating film INS may be at least partially formed on the surfaces of the light emitting elements LD and/or the electrode part EP. For example, the insulating film INS may be formed to cover the light emitting elements LD, and may be partially removed to expose at least a portion of the first semiconductor layer L1 of the light emitting elements LD. The insulating film INS may be formed to cover the electrode part EP, and may be partially removed to expose a portion of the upper surface of the electrode part EP.

The first reflective layer RF1 may be partially formed on the side surfaces of the light emitting elements LD and/or the electrode part EP. For example, the first reflective layer RF1 may be partially removed to expose the upper surfaces of the light emitting elements LD and/or the upper surface of the electrode part EP.

Figure 29:
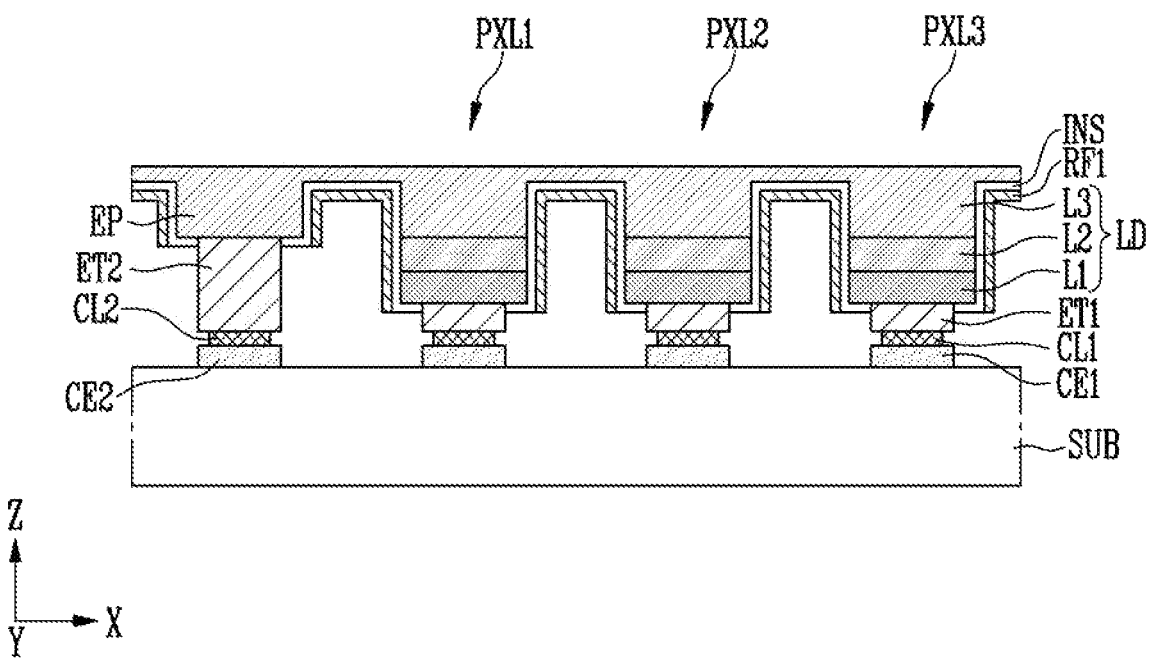

Referring to FIG. 29, the light emitting elements LD may be connected to the substrate SUB. The substrate SUB may be a driving substrate including circuit elements including transistors constituting the pixel circuit (PXC of FIG. 2) of each pixel PXL.

The first electrode ET1 formed on the light emitting elements LD may be bonded to the first connection electrode CE1 formed on the substrate SUB. In addition, the second electrode ET2 formed on the electrode part EP may be bonded to the second connection electrode CE2 formed on the substrate SUB. Connection layers CL1 and CL2 for bonding may be provided between the light emitting elements LD and the substrate SUB. A first connection layer CL1 is disposed between the first electrode ET1 and the first connection electrode CE1, so that the first electrode ET1 and the first connection electrode CE1 are easily bonded to each other by the first connection layer CL1. A second connection layer CL2 is disposed between the second electrode ET2 and the second connection electrode CE2, so that the second electrode ET2 and the second connection electrode CE2 are easily bonded to each other by the second connection layer CL2.

Each of the first and second connection layers CL1 and CL2 may include a metal or a metal oxide. For example, the first and second connection layers CL1 and CL2 may include copper (Cu), gold (Au), chromium (Cr), titanium (Ti), aluminum (Al), nickel (Ni), indium tin oxide (ITO), and oxides or alloys thereof, but the embodiments are not necessarily limited thereto.

After the light emitting elements LD are bonded to the substrate SUB, the stack substrate 1 may be separated from the light emitting elements LD.

Figure 30:
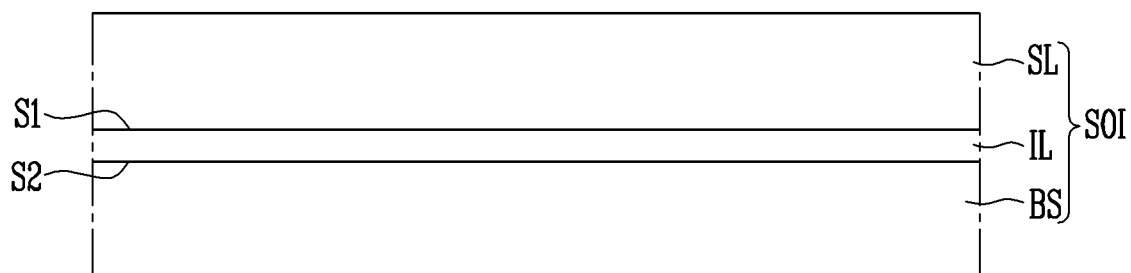

Referring to FIG. 30, a color control substrate SOI may be prepared to form a color control layer CCT. The color control substrate SOI may include an insulating layer IL disposed between a base layer BS and a silicon layer SL.

The insulating layer IL may be formed using silicon oxide ($SiO_x$), silicon nitride ($SiN_x$), silicon oxynitride ($SiO_xN_y$), silicon oxycarbide ($SiO_xC_y$), aluminum oxide ($AlO_x$), aluminum nitride ($AlN_x$), zirconium oxide ($ZrO_x$), hafnium oxide ($HfO_x$), or titanium oxide ($TiO_x$), but the embodiments is not necessarily limited thereto. The silicon layer SL may be provided on a first surface S1 of the insulating layer IL. The base layer BS may be provided on a second surface S2 of the insulating layer IL. The base layer BS may use a silicon wafer, but the embodiments is not limited thereto. The second surface S2 of the insulating layer IL is a surface opposite to the first surface S1, and may correspond to a display surface (or a front surface) of the display panel PNL (refer to FIG. 1) in which light is emitted from the pixel PXL.

Figure 31:
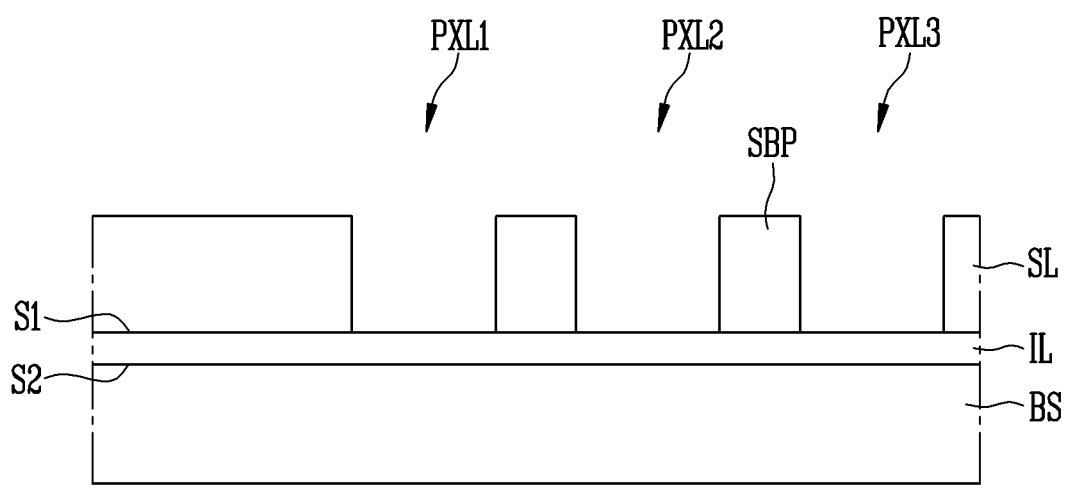

Referring to FIG. 31, bank patterns SBP may be formed by patterning the silicon layer SL. The bank patterns SBP may be formed at a boundary between the first to third pixels PXL1, PXL2, and PXL3. In the process of patterning the bank patterns SBP, the silicon layer SL overlapping the pixels PXL may be completely removed to expose the first surface S1 of the insulating layer IL disposed below.

Figure 32:
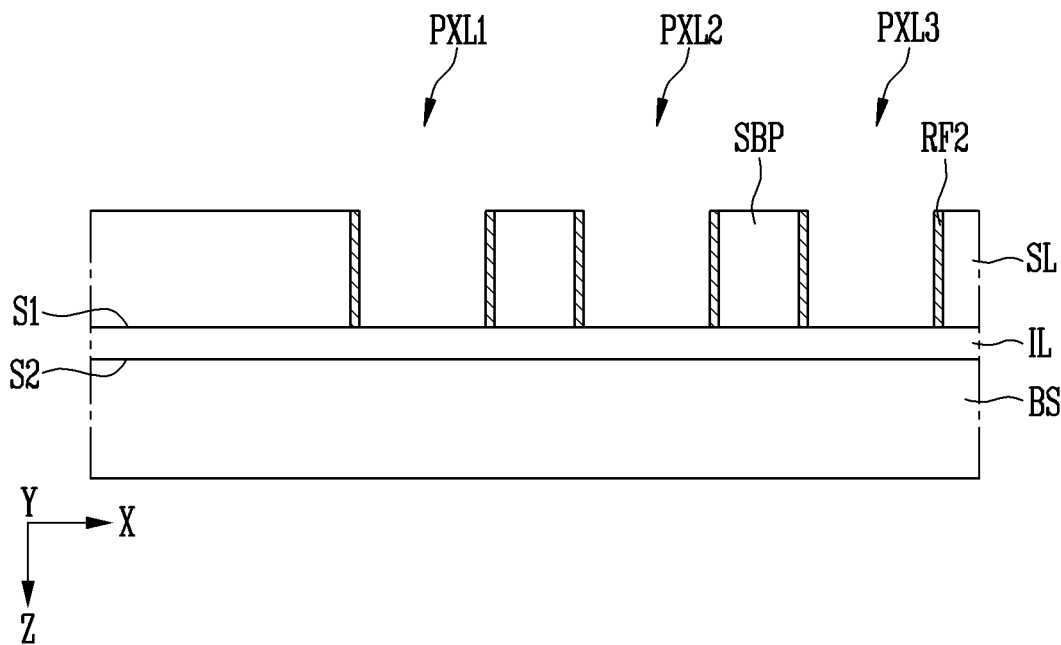

Referring to FIG. 32, a second reflective layer RF2 may be formed on the bank patterns SBP. The second reflective layer RF2 may be partially formed on the side surfaces of the bank patterns SBP. The second reflective layer RF2 may reflect light emitted from the light emitting elements LD to improve light output efficiency of the display panel PNL (refer to FIG. 1). The second reflective layer RF2 may be disposed on the side surfaces of the bank patterns SBP to prevent color mixing between adjacent pixels PXL. The material of the second reflective layer RF2 is not particularly limited, and may be formed of a variety of reflective materials.

Figure 33:
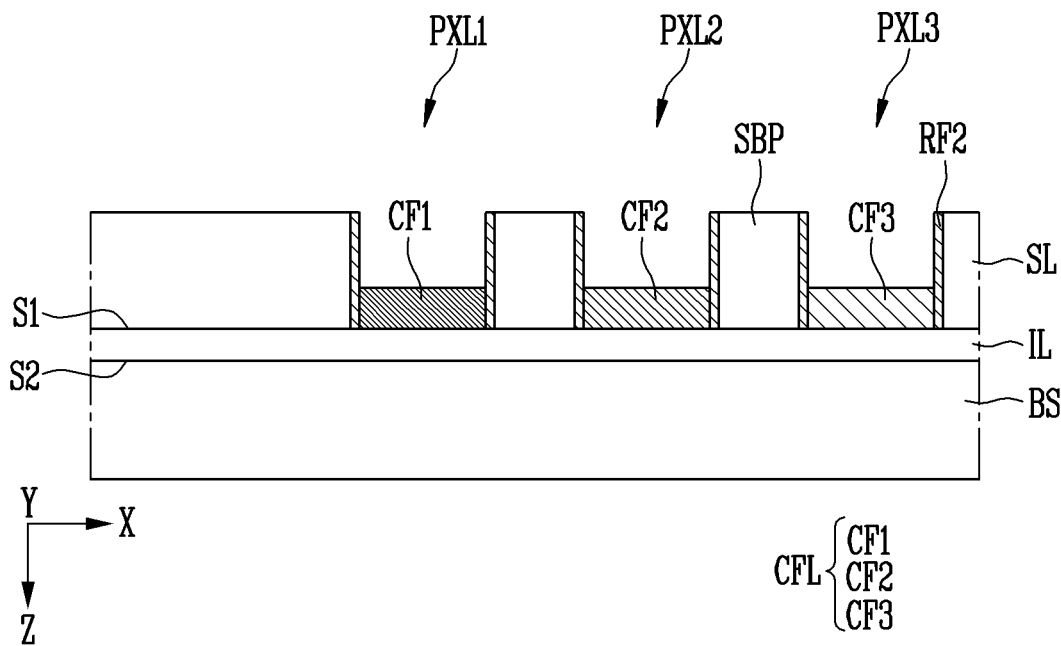

Referring to FIG. 33, a color filter layer CFL may be formed between the bank patterns SBP. The color filter layer CFL may be formed between the bank patterns SBP on the first surface S1 of the insulating layer IL. The color filter layer CFL may be formed in a space or an opening defined by the bank patterns SBP. As such, when the color filter layer CFL is formed in the space surrounded by the bank patterns SBP, it is possible to improve light leakage and/or color mixing caused by overlay defects as described above. The color filter layer CFL may include color filters CF1, CF2, and CF3 matching the color of each pixel PXL. Since the color filter layer CFL has been described in detail with reference to FIG. 6 and the like, the descriptions will not be repeated.

Figure 34:
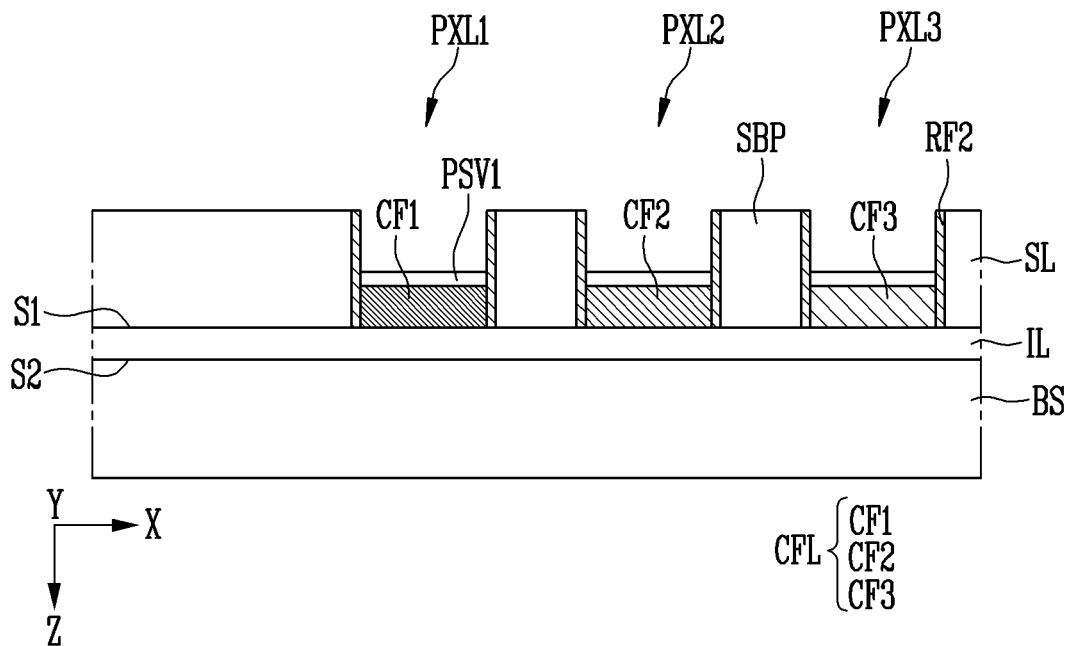

Referring to FIG. 34, a first passivation layer PSV1 may be formed on the color filter layer CFL. The first passivation layer PSV1 may directly cover the color filter layer CFL. The first passivation layer PSV1 may be formed in each of the first to third pixels PXL1, PXL2, and PXL3. However, the embodiments are not necessarily limited thereto, and the first passivation layer PSV1 may be formed over the first to third pixels PXL1, PXL2, and PXL3. Since the first passivation layer PSV1 has been described in detail with reference to FIG. 6 and the like, the descriptions will not be repeated.

Figure 35:
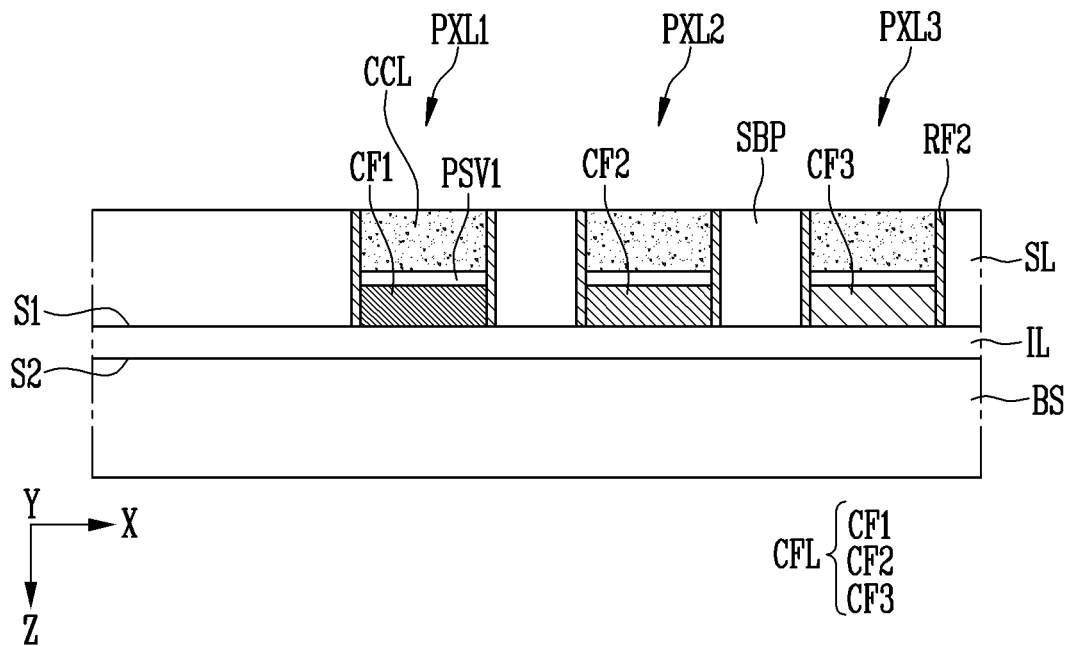

Referring to FIG. 35, a color conversion layer CCL may be formed on the first passivation layer PSV1. The color conversion layer CCL may be formed between the bank patterns SBP. The color conversion layer CCL may be formed between the side surfaces of the bank patterns SBP. The color conversion layer CCL may be formed in a space, or an opening defined by the bank patterns SBP.

The color conversion layer CCL may include quantum dots as a color conversion material that converts light emitted from the light emitting elements LD into light of a different color. Since the color conversion layer CCL has been described in detail with reference to FIG. 6 and the like, the descriptions will not be repeated.

Figure 36:
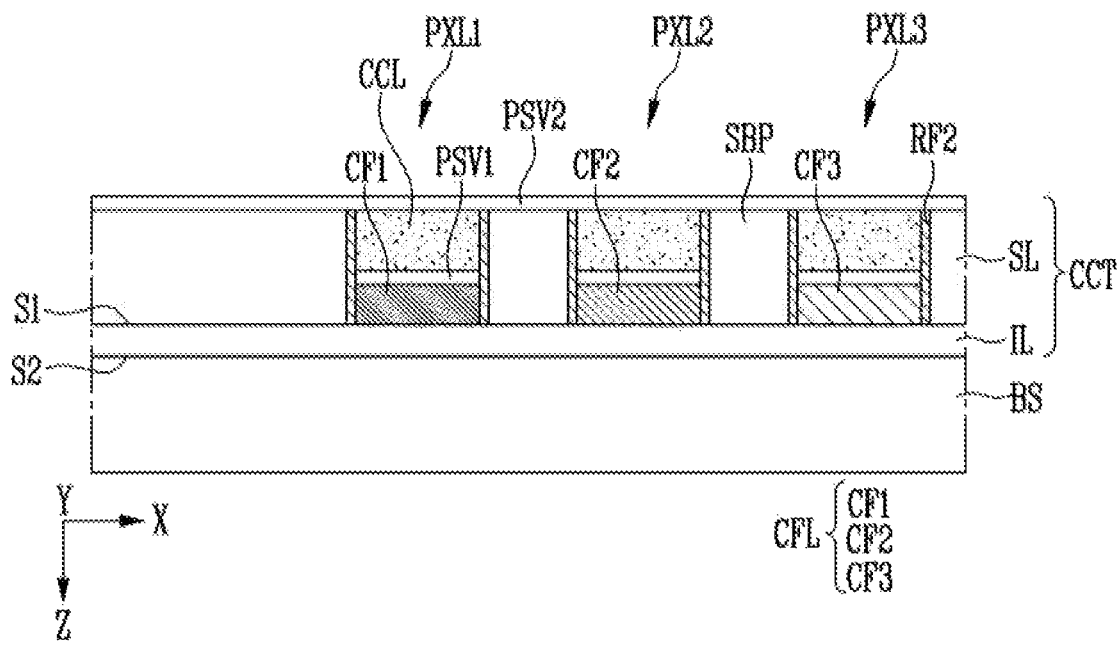

Referring to FIG. 36, a second passivation layer PSV2 is formed on the color conversion layer CCL to form a color control layer CCT. Since the second passivation layer PSV2 has been described in detail with reference to FIG. 6 and the like, the descriptions will not be repeated.

Figure 37:
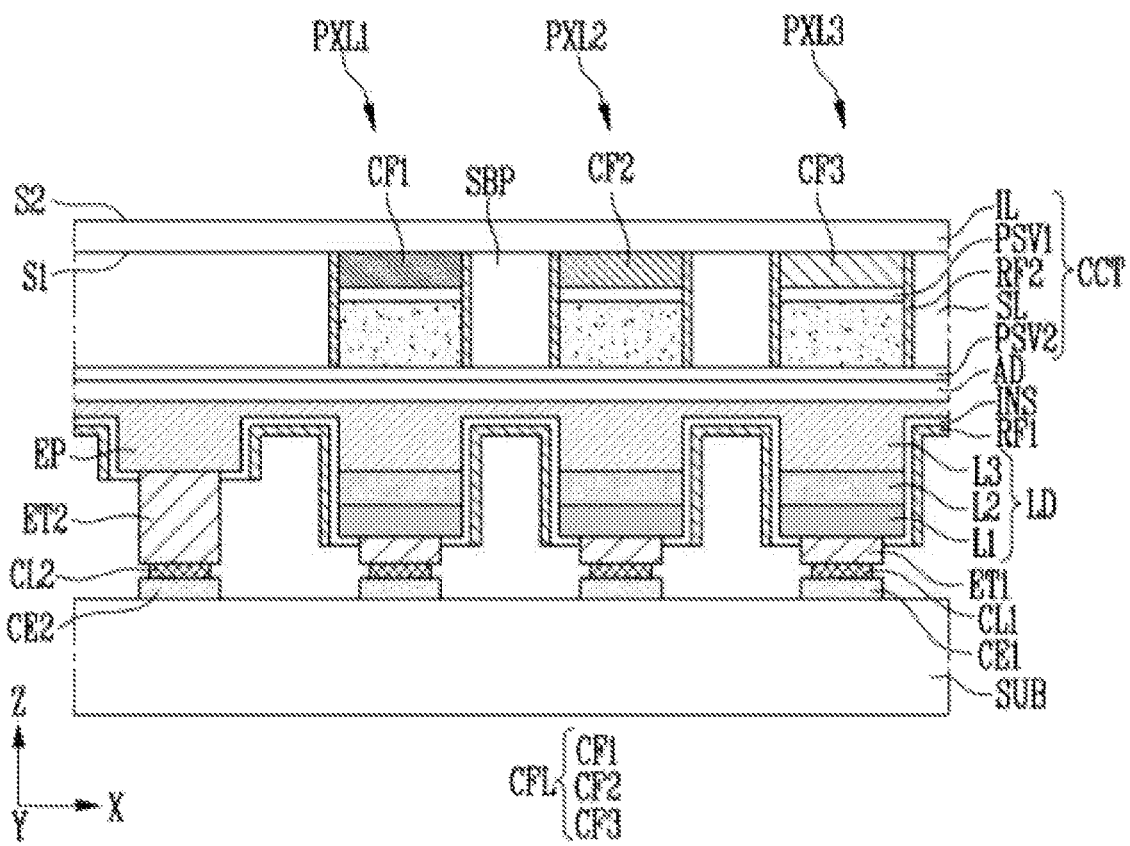

Referring to FIG. 37, the color control layer CCT is connected to the light emitting elements LD of FIG. 29. The color control layer CCT may be connected to the light emitting elements LD by at least one adhesive layer AD. For example, the second passivation layer PSV2 of the color control layer CCT may be connected to the second semiconductor layer L3 of the light emitting elements LD by the adhesive layer AD. The material of the adhesive layer AD is not particularly limited and may be formed of a variety of adhesive materials.

After the color control layer CCT and the light emitting elements LD are connected, the base layer BS may be separated from the second surface S2 of the insulating layer IL.

Subsequently, the light blocking layer BM (refer to FIG. 6) may be formed on the second surface S2 of the insulating layer IL to complete the display device of FIG. 6. The light blocking layer BM may be partially formed at the boundary of the pixels PXL. For example, the light blocking layer BM may be formed on the bank patterns SBP to overlap the bank patterns SBP in the third direction (Z-axis direction). When the light blocking layer BM is formed on the bank patterns SBP, color mixing recognized from the front or side of the display device may be more effectively prevented. The material of the light blocking layer BM is not particularly limited, and may include a variety of light blocking materials.

According to the above-described embodiments, since the color filter layer CFL is formed between the bank patterns SBP that is in the space or the opening surrounded by the bank patterns SBP, overlay defects may be prevented, thereby effectively improving light leakage and/or color mixing as described above.

Hereinafter, an electronic apparatus to which the display devices of the above-described embodiments are applicable will be described.

FIGS. 38 to 41 are schematic views illustrating electronic apparatuses according to embodiments.

Figure 38:
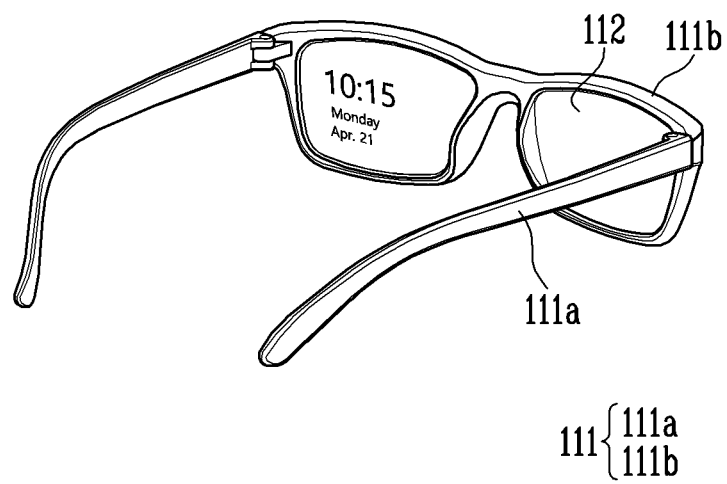
FIGS. 38 to 41 are schematic views illustrating an electronic device according to embodiments.

Referring to FIG. 38, the display devices according to the above-described embodiments may be applied to a smart glass. The smart glass may include a frame 111 and a lens unit 112. The smart glass is a wearable electronic device that can be worn on a user's face, and a portion of the frame 111 may be folded or unfolded. For example, the smart glass may be a wearable device for augmented reality (AR).

The frame 111 may include a housing 111b supporting the lens unit 112 and a leg portion 111a for wearing by the user. The leg portion 111a may be connected to the housing 111b by a hinge and may be folded or unfolded.

A battery, a touch pad, a microphone, and/or a camera may be embedded in the frame 111. A projector that outputs light and/or a processor that controls an optical signal may be embedded in the frame 111.

The lens unit 112 may be an optical member that transmits or reflects light. The lens unit 112 may include glass and/or a transparent synthetic resin.

The display devices according to the above-described embodiments may be applied to the lens unit 112. For example, the user may recognize an image displayed by the optical signal transmitted from the projector of the frame 111 through the lens unit 112. For example, the user may recognize information such as time and date displayed on the lens unit 112.

Figure 39:
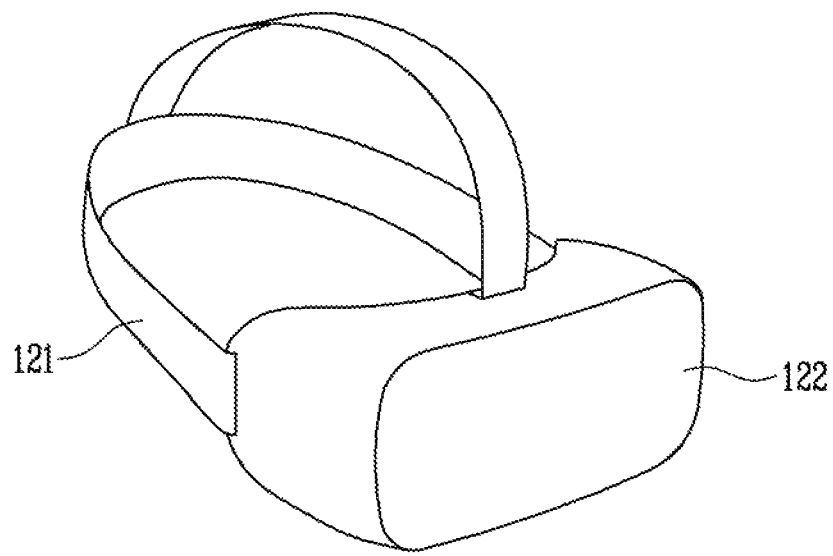

Referring to FIG. 39, the display devices according to the above-described embodiments may be applied to a head mounted display (HMD). The head mounted display may include a head mounting band 121 and a display storage case 122. For example, the head mounted display may be a wearable electronic device that can be worn on a user's head.

The head mounting band 121 may be connected to the display storage case 122 to fix the display storage case 122. The head mounting band 121 includes a horizontal band and a vertical band for fixing the head mounted display to the user's head, as illustrated in FIG. 39. The horizontal band may surround the side of the user's head, and the vertical band may surround the upper portion of the user's head. However, the embodiments are not necessarily limited thereto, and the head mounting band 121 may be implemented in the form of an eyeglass frame or a helmet.

The display storage case 122 may accommodate the display device and may include at least one lens. At least one lens may provide an image to the user. For example, the display devices according to the above-described embodiments may be applied to a left eye lens and a right eye lens implemented in the display storage case 122.

Figure 40:
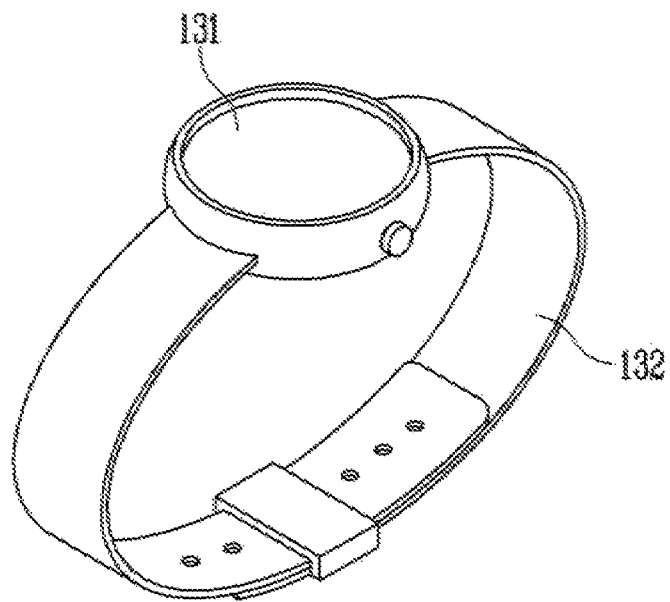

Referring to FIG. 40, the display devices according to the embodiments described above may be applied to a smart watch. The smart watch may include a display unit 131 and a strap unit 132. The smart watch is a wearable electronic device, and the strap unit 132 may be mounted on the user's wrist. The display devices according to the above-described embodiments may be applied to the display unit 131. For example, the display unit 131 may provide image data including information such as time and date.

Figure 41:
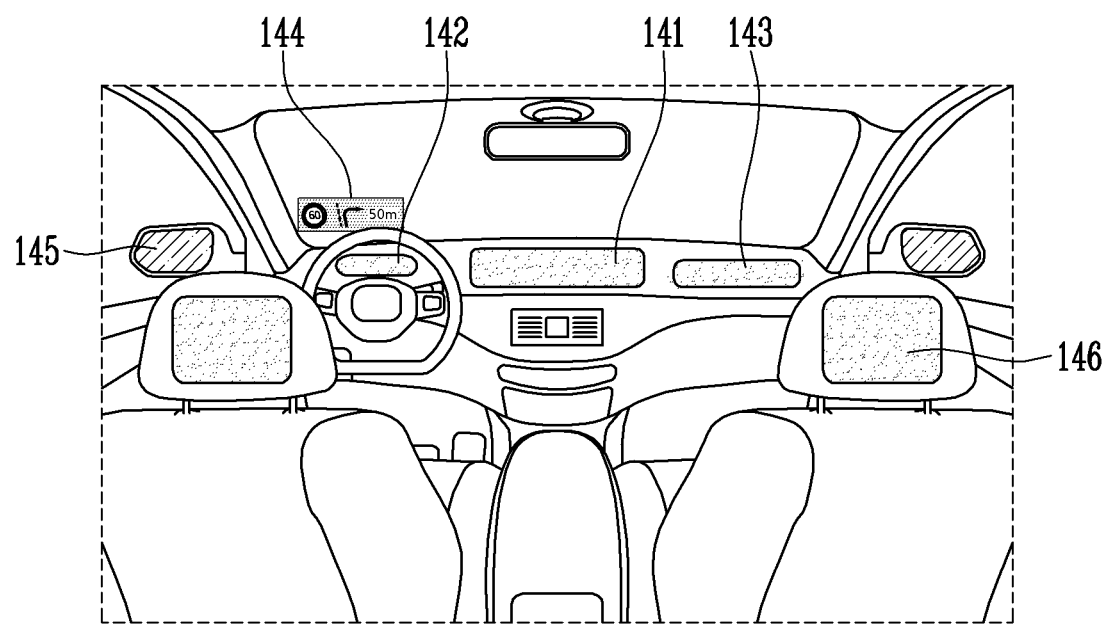

Referring to FIG. 41, the display devices according to the above-described embodiments may be applied to an automotive display. For example, the automotive display may refer to an electronic apparatus installed inside and outside a vehicle to provide image data.

For example, the display devices according to the embodiments described above may be applied to at least one of an infotainment panel 141, a cluster 142, a co-driver display 143, and a head-up display 144, a side mirror display 145, and a rear seat display 146, which are provided in the vehicle.

According to an embodiment of the disclosure, since the color filter layer is formed between the bank patterns, in the space or the opening surrounded by the bank patterns, overlay defects may be prevented, thereby effectively improving light leakage or color mixing.

Effects according to the embodiments are not limited to the contents presented above, and other effects may be incorporated in the specification.

Embodiments have been disclosed herein, and although terms are employed, they are used and are to be interpreted in a generic and descriptive sense only and not for purpose of limitation. Those of ordinary skill in the technical field related to the embodiment will appreciate that the features, characteristics, and/or elements described in connection with an embodiment may be used singly or in combination with features, characteristics, and/or elements described in connection with other embodiments unless otherwise specifically indicated without departing from the spirit and the scope of the above description. The scope of the embodiments is shown in the claims rather than the foregoing description, and all differences within the scope equivalent thereto should be construed as falling within the embodiments.

What is claimed is:

1. A display device comprising:
bank patterns disposed on a substrate;
light emitting elements disposed between side surfaces of the bank patterns on the substrate, each of the light emitting elements and the bank patterns including:
a first semiconductor layer;
a second semiconductor layer; and
an active layer disposed between the first semiconductor layer and the second semiconductor layer; and
a color filter layer disposed between the side surfaces of the bank patterns and disposed on the light emitting elements,
wherein the active layers of the light emitting elements are spaced apart from the active layers of the bank patterns.

2. The display device of claim 1, wherein at least one material of the light emitting elements is equivalent to at least one material of the bank patterns.

3. The display device of claim 1, wherein the bank patterns further include a first mask layer and a second mask layer that are disposed on the second semiconductor layer.

4. The display device of claim 1, further comprising:
a color conversion layer disposed between the side surfaces of the bank patterns and disposed on the light emitting elements.

5. The display device of claim 4, further comprising:
a passivation layer disposed between the color conversion layer and the color filter layer.

6. The display device of claim 1, further comprising:
a reflective layer disposed on the side surfaces of the bank patterns.

7. The display device of claim 1, further comprising:
a light blocking layer disposed on upper surfaces of the bank patterns.

8. A display device comprising:
light emitting elements disposed on a substrate; and
a color control layer disposed on the light emitting elements, the color control layer including:
a silicon layer forming bank patterns;
a first reflective layer disposed on lateral side surfaces of the bank patterns and exposing uppermost surfaces of the bank patterns; and
a color filter layer disposed between the lateral side surfaces of the bank patterns.

9. The display device of claim 8, further comprising:
a color conversion layer disposed between the bank patterns.

10. The display device of claim 9, further comprising:
a passivation layer disposed between the color filter layer and the color conversion layer.

11. The display device of claim 8, further comprising:
a second reflective layer disposed on and between lateral side surfaces of the light emitting elements, the uppermost surfaces of the bank patterns overlapping portions of the second reflective layer.

12. The display device of claim 8, further comprising:
a light blocking layer overlapping the bank patterns.

13. The display device of claim 8, further comprising:
an adhesive layer disposed between the color control layer and the light emitting elements.

* * * * *